US012387450B2

(12) United States Patent
Stegner et al.

(10) Patent No.: US 12,387,450 B2
(45) Date of Patent: *Aug. 12, 2025

(54) VISUALIZATION TOOL FOR CROSS SECTIONS

(71) Applicant: Procore Technologies, Inc., Carpinteria, CA (US)

(72) Inventors: Maria E. Stegner, Goleta, CA (US); Taylor James Klündt, Spokane, WA (US)

(73) Assignee: Procure Technologies, Inc., Carpinteria, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/752,074

(22) Filed: Jun. 24, 2024

(65) Prior Publication Data

US 2024/0420438 A1 Dec. 19, 2024

Related U.S. Application Data

(63) Continuation of application No. 18/334,832, filed on Jun. 14, 2023, now Pat. No. 12,020,394.

(51) Int. Cl.
*G06T 19/20* (2011.01)
*G06F 3/04815* (2022.01)
(Continued)

(52) U.S. Cl.
CPC .......... *G06T 19/20* (2013.01); *G06F 3/04815* (2013.01); *G06F 3/04845* (2013.01);
(Continued)

(58) Field of Classification Search
CPC ................. G06T 19/20; G06T 2200/24; G06T 2219/008; G06T 2219/2004;
(Continued)

(56) References Cited

U.S. PATENT DOCUMENTS 8,369,610 B1 2/2013 Korobkin
9,129,433 B1 9/2015 Korobkin
(Continued)

OTHER PUBLICATIONS

Abioye, Sofiat O. et al., "Artificial Intelligence in the Construction Industry: A Review of Present Status, Opportunities and Future Challenges", Journal of Building Engineering, vol. 44, Oct. 5, 2021, 13 pages.

*Primary Examiner* — Tadesse Hailu
(74) *Attorney, Agent, or Firm* — Lee Sullivan Shea & Smith LLP

(57) ABSTRACT

An example computing system is configured to (i) present a three-dimensional (3D) visualization of a 3D model of a construction project; (ii) while presenting the 3D visualization of the 3D model of the construction project, present (a) a sectioning plane that defines a view of the 3D visualization of the 3D model of the construction project and (b) a sectioning control tool comprising an idealized 3D model, the sectioning control tool configured to set a location of the sectioning plane; (iii) receive user input indicating an interaction with the idealized 3D model; and (iv) based on the user input, adjust the location of the sectioning plane relative to the 3D visualization model of the 3D model of the construction project and thereby adjust the view of the 3D visualization of the 3D model of the construction project.

20 Claims, 15 Drawing Sheets

(51) Int. Cl.
*G06F 3/04845* (2022.01)
*G06F 30/12* (2020.01)

(52) U.S. Cl.
CPC .......... *G06F 30/12* (2020.01); *G06T 2200/24* (2013.01); *G06T 2210/04* (2013.01); *G06T 2219/008* (2013.01); *G06T 2219/2004* (2013.01); *G06T 2219/2016* (2013.01)

(58) Field of Classification Search
CPC ......... G06T 2219/2016; G06F 3/04845; G06F 3/04815; G06F 30/12
See application file for complete search history.

(56) References Cited

U.S. PATENT DOCUMENTS

| | | | |
|---|---|---|---|
| 9,437,044 | B2 | 9/2016 | Ege et al. |
| 10,593,104 | B2 | 3/2020 | Robert et al. |
| 10,943,038 | B1 | 3/2021 | McCool et al. |
| 11,182,513 | B2 | 11/2021 | Myers et al. |
| 11,520,415 | B2 | 12/2022 | Douglas et al. |
| 11,574,086 | B2 | 2/2023 | Myers et al. |
| 11,586,918 | B2 * | 2/2023 | Alves ........................ G06N 3/08 |
| 11,714,930 | B2 | 8/2023 | Ramanasankaran et al. |
| 11,797,147 | B2 | 10/2023 | McKee et al. |
| 11,841,924 | B2 | 12/2023 | Wu |
| 11,893,664 | B2 * | 2/2024 | Myers ................... G06T 11/203 |
| 11,900,322 | B2 | 2/2024 | McKee et al. |
| 2008/0094398 | A1 | 4/2008 | Ng et al. |
| 2009/0216501 | A1 | 8/2009 | Yeow et al. |
| 2011/0050848 | A1 * | 3/2011 | Rohaly ................... G06T 15/10 |
| | | | 348/43 |
| 2014/0320488 | A1 | 10/2014 | Ege |
| 2018/0114264 | A1 | 4/2018 | Rafii et al. |
| 2018/0349522 | A1 | 12/2018 | Aphek et al. |
| 2020/0265121 | A1 * | 8/2020 | Myers ................... G06T 11/203 |
| 2021/0019954 | A1 | 1/2021 | Trinh et al. |
| 2021/0200713 | A1 | 7/2021 | Sridharan et al. |
| 2021/0303759 | A1 | 9/2021 | Parekh et al. |
| 2021/0350632 | A1 | 11/2021 | Ghassaei |
| 2022/0165026 | A1 | 5/2022 | Bieser et al. |
| 2022/0318441 | A1 | 10/2022 | Jagannathan et al. |
| 2022/0318442 | A1 | 10/2022 | Jagannathan et al. |
| 2022/0383600 | A1 * | 12/2022 | Jovanovic ............... G06T 15/20 |
| 2023/0393443 | A1 * | 12/2023 | Marquez ................ G05B 19/042 |
| 2024/0404219 | A1 * | 12/2024 | Alexander ............ G06T 19/006 |

* cited by examiner

VISUALIZATION TOOL FOR CROSS SECTIONS

CROSS-REFERENCE TO RELATED APPLICATION

This application claims the benefit of priority under 325 U.S.C. § 120 to U.S. application Ser. No. 18/334,832 filed Jun. 14, 2023 and entitled "Visualization Tool for Cross Sections," the contents of which are incorporated by reference herein in their entirety.

BACKGROUND

Construction projects are often complex endeavors involving the coordination of many professionals across several discrete phases. Typically, a construction project commences with a design phase, where architects design the overall shape and layout of a construction project, such as a building. Next, engineers engage in a planning phase where they take the architects' designs and produce engineering drawings and plans for the construction of the project. At this stage, engineers may also design various portions of the project's infrastructure, such as HVAC, plumbing, electrical, etc., and produce plans reflecting these designs as well. After, or perhaps in conjunction with, the planning phase, contractors may engage in a logistics phase to review these plans and begin to allocate various resources to the project, including determining what materials to purchase, scheduling delivery, and developing a plan for carrying out the actual construction of the project. Finally, during the construction phase, construction professionals begin to construct the project based on the finalized plans.

OVERVIEW

As a general matter, one phase of a construction project involves the creation, review, and sometimes revision, of plans of the construction project. In most cases, these plans comprise visual representations of the construction project that visually communicate information about the construction project, such as how to assemble or construct the project. Such visual representations tend to take one of at least two different forms. One form may be a two-dimensional technical drawing, such as an architectural drawing or a construction blueprint, in which two-dimensional line segments of the drawing represent certain physical elements of the construction project like walls and ducts. In this respect, a two-dimensional technical drawing could be embodied either in paper form or in a computerized form, such as an image file (e.g., a PDF, JPEG, etc.).

Two-dimensional technical drawings have advantages. For instance, they are often set out in a universally recognized format that most, if not all, construction professionals can read and understand. Further, they are designed to be relatively compact, with one drawing being arranged to fit on a single piece of paper or in a computerized file format that requires minimal processing power and computer storage to view (e.g., a PDF viewer, JPEG viewer, etc.). Yet, two-dimensional drawings have disadvantages as well. For instance, it often takes multiple drawings in order to visually communicate an overview of an entire construction project. This is because two-dimensional drawings tend not to efficiently present information about the construction project from a third (e.g., vertical) dimension. For example, a construction project may have at least one two-dimensional technical drawing per floor of the construction project. Thus, for a construction project spanning, say, ten floors, the construction project will have at least ten two-dimensional technical drawings, and likely more to fully visually communicate the various aspects of the construction project.

To advance over two-dimensional technical drawings, computerized, three-dimensional technology was developed as another form in which information about a construction project can be visually communicated. In this respect, a three-dimensional model of the construction project would be embodied in a computerized form, such as in a building information model (BIM) file, with three-dimensional meshes visually representing the physical elements of the construction project (e.g., walls, ducts, etc.). Specialized software is configured to access the BIM file and render a three-dimensional view of the construction project from one or more perspectives. This provides some advantages over two-dimensional technical drawings, namely that a construction professional could often get a more complete overview of the construction project based on a single three-dimensional view and thus may not have to shuffle through multiple two-dimensional drawings in order to conceptualize what the construction project looks like. In addition, the specialized software allows a construction professional to navigate throughout the three-dimensional view of the BIM file and focus on elements of interest in the construction project, such as a particular wall or duct.

However, given the vast amount of information that is presented in a three-dimensional view of a construction project, such views may be overwhelming, for example, when a construction professional only desires to view an isolated portion of the three-dimensional view. Accordingly, it may be desirable to reduce the volume of information that is presented in a given three-dimensional view, such as by removing portions of the view, in order to isolate a portion of the view. However, existing technology for enabling users of BIM software to remove portions of a three-dimensional view of a construction project from view have several limitations. For instance, existing technology for maneuvering a sectioning plane or sectioning box to remove a portion of a three-dimensional view of a construction project lacks flexibility, is not intuitive, and does not provide users with an easy-to-use toolkit for using such sectioning planes and/or sectioning boxes. Further, currently technology provides limited granularity for such maneuvers, leaving users unable to adequately remove portions of three-dimensional views with a desired level of specificity and accuracy.

To address these problems and others, disclosed herein is a software application that enables a computing device to present, via a graphical user interface (GUI) of a BIM viewer software application running on the computing device, (i) a sectioning control tool comprising an idealized three-dimensional (3D) model of a construction project, as well as (ii) a sectioning plane and/or a sectioning box that can be flexibly and intuitively manipulated to adjust the view of a 3D visualization of a 3D model of the construction project. The sectioning plane and/or sectioning box presented via the GUI of the BIM viewer software application running on the computing device may be maneuverable by user input to remove portions of the 3D visualization in numerous different ways, depending on the needs of the user.

Further, the idealized 3D model may comprise an idealized sectioning plane and/or an idealized sectioning box that may (i) track the sectioning plane and/or sectioning box of the 3D visualization, as well as (ii) be interactable by a user to control movement of the sectioning plane and/or sectioning box associated with the 3D visualization, providing users with a convenient and easy to interpret visual tool for implementing the sectioning functionality of the BIM viewer software application running on the computing device.

Further yet, the computing device may present, via the GUI of the BIM viewer software application running on the computing device, a 2D visualization of a 2D model of the construction project. The 2D visualization may include a sectioning line and/or a sectioning square that may track the location(s) of (i) the sectioning plane and/or sectioning box of the 3D visualization, as well as (ii) the idealized sectioning plane and/or idealized sectioning box of the idealized 3D model. Advantageously, the sectioning line and/or sectioning square shown via the 2D visualization may also be interactable by a user to control movement of the sectioning plane and/or sectioning box and thereby adjust the view of the 3D visualization, which may also be reflected in the idealized sectioning plane and/or idealized sectioning box of the idealized 3D model, providing users with yet another convenient tool for implementing the sectioning functionality of the BIM viewer software application running on the computing device.

Accordingly, in one aspect, disclosed herein is a method that involves (i) presenting a 3D visualization of a 3D model of a construction project, (ii) while presenting the 3D visualization of the 3D model of the construction project, presenting (a) a sectioning plane that defines a view of the 3D visualization of the 3D model of the construction project and (b) a sectioning control tool comprising an idealized 3D model, the sectioning control tool configured to set a location of the sectioning plane, (iii) receiving user input indicating an interaction with the idealized 3D model, and (iv) based on the user input, adjusting the location of the sectioning plane relative to the 3D visualization of the 3D model of the construction project and thereby adjusting the view of the 3D visualization of the 3D model of the construction project.

In another aspect, disclosed herein is a computing system that includes a network interface, at least one processor, a non-transitory computer-readable medium, and program instructions stored on the non-transitory computer-readable medium that are executable by the at least one processor to cause the computing system to carry out the functions disclosed herein, including but not limited to the functions of the foregoing methods.

In yet another aspect, disclosed herein is a non-transitory computer-readable storage medium provisioned with software that is executable to cause a computing system to carry out the functions disclosed herein, including but not limited to the functions of the foregoing methods.

One of ordinary skill in the art will appreciate these as well as numerous other aspects in reading the following disclosure.

Figure 1:
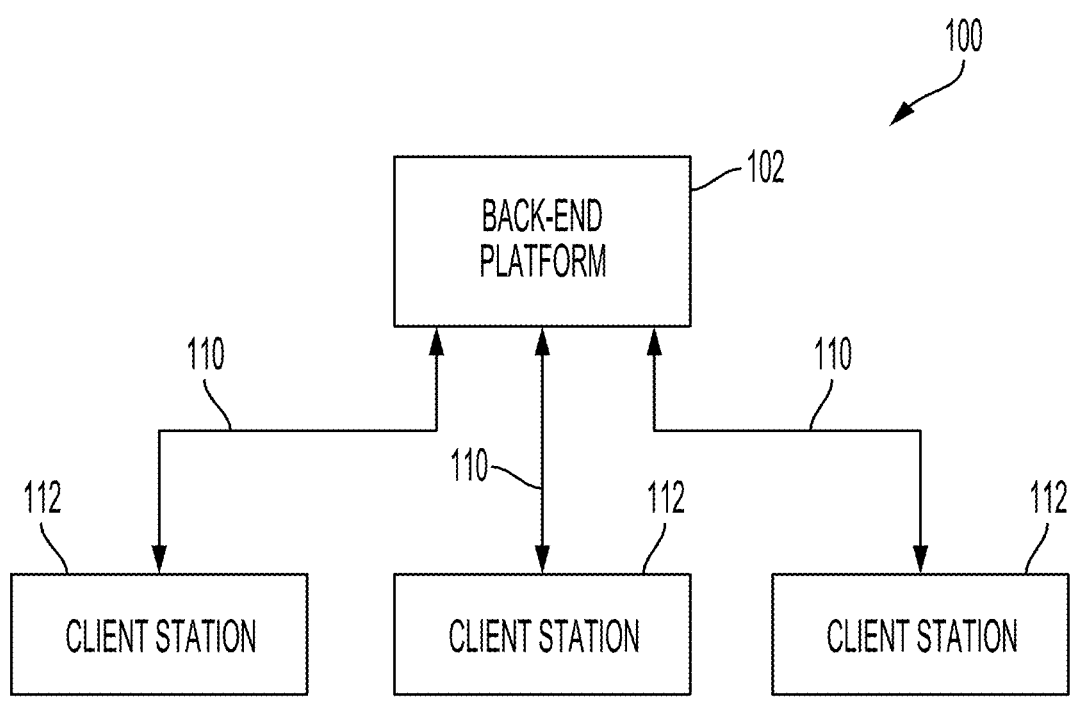
FIG. 1 depicts an example network configuration in which example embodiments may be implemented.

Features, aspects, and advantages of the presently disclosed technology may be better understood with regard to the following description, appended claims, and accompanying drawings, as listed below. The drawings are for the purpose of illustrating example embodiments, but those of ordinary skill in the art will understand that the technology disclosed herein is not limited to the arrangements and/or instrumentality shown in the drawings.

DETAILED DESCRIPTION

The following disclosure makes reference to the accompanying figures and several example embodiments. One of ordinary skill in the art should understand that such references are for the purpose of explanation only and are therefore not meant to be limiting. Part or all of the disclosed systems, devices, and methods may be rearranged, combined, added to, and/or removed in a variety of manners, each of which is contemplated herein.

I. EXAMPLE SYSTEM CONFIGURATION

As described above, the present disclosure is generally directed to a software application that enables a computing system to provide improved sectioning functionality to flexibly and intuitively remove portions of a 3D visualization of a 3D model of a construction project.

As one possible implementation, this software technology may include both front-end software running on client stations that are accessible to individuals associated with construction projects (e.g., contractors, project managers, architects, engineers, designers, etc.) and back-end software running on a back-end platform (sometimes referred to as a "cloud" platform) that interacts with and/or drives the front-end software, and which may be operated (either directly or indirectly) by the provider of the front-end client software. As another possible implementation, this software technology may include front-end client software that runs on client stations without interaction with a back-end platform. The software technology disclosed herein may take other forms as well.

In general, such front-end client software may enable one or more individuals responsible for a construction project to perform various tasks related to the management and construction of the project, which may take various forms. According to some implementations, these tasks may include: rendering three-dimensional views of the construction project and navigating through the various three-dimensional views of the construction project, as some non-limiting examples. Further, such front-end client software may take various forms, examples of which may include a native application (e.g., a mobile application) and/or a web application running on a client station, among other possibilities.

Turning now to the figures, FIG. 1 depicts an example network configuration 100 in which example embodiments of the present disclosure may be implemented. As shown in FIG. 1, network configuration 100 includes a back-end platform 102 that may be communicatively coupled to one or more client stations, depicted here, for the sake of discussion, as three client stations 112.

In general, back-end platform 102 may comprise one or more computing systems that have been provisioned with software for carrying out one or more of the platform functions disclosed herein, including but not limited to functions related to the disclosed sectioning control. The one or more computing systems of back-end platform 102 may take various forms and be arranged in various manners.

For instance, as one possibility, back-end platform 102 may comprise computing infrastructure of a public, private, and/or hybrid cloud (e.g., computing and/or storage clusters) that has been provisioned with software for carrying out one or more of the platform functions disclosed herein. In this respect, the entity that owns and operates back-end platform 102 may either supply its own cloud infrastructure or may obtain the cloud infrastructure from a third-party provider of "on demand" computing resources, such include Amazon Web Services (AWS) or the like. As another possibility, back-end platform 102 may comprise one or more dedicated servers that have been provisioned with software for carrying out one or more of the platform functions disclosed herein. Other implementations of back-end platform 102 are possible as well.

In turn, client stations 112 may each be any computing device that is capable of running the front-end software disclosed herein. In this respect, client stations 112 may each include hardware components such as a processor, data storage, a user interface, and a network interface, among others, as well as software components that facilitate the client station's ability to run the front-end software disclosed herein (e.g., operating system software, web browser software, etc.). As representative examples, client stations 112 may each take the form of a desktop computer, a laptop, a netbook, a tablet, a smartphone, and/or a personal digital assistant (PDA), among other possibilities.

As further depicted in FIG. 1, back-end platform 102 is configured to interact with one or more client stations 112 over respective communication paths 110. Each communication path 110 between back-end platform 102 and one of client stations 112 may generally comprise one or more communication networks and/or communications links, which may take any of various forms. For instance, each respective communication path 110 with back-end platform 102 may include any one or more of point-to-point links, Personal Area Networks (PANs), Local-Area Networks (LANs), Wide-Area Networks (WANs) such as the Internet or cellular networks, cloud networks, and/or operational technology (OT) networks, among other possibilities. Further, the communication networks and/or links that make up each respective communication path 110 with back-end platform 102 may be wireless, wired, or some combination thereof, and may carry data according to any of various different communication protocols. Although not shown, the respective communication paths 110 with back-end platform 102 may also include one or more intermediate systems. For example, it is possible that back-end platform 102 may communicate with a given client station 112 via one or more intermediary systems, such as a host server (not shown). Many other configurations are also possible.

The interaction between client stations 112 and back-end platform 102 may take various forms. As one possibility, client stations 112 may send certain user input related to a construction project to back-end platform 102, which may in turn trigger back-end platform 102 to take one or more actions based on the user input. As another possibility, client stations 112 may send a request to back-end platform 102 for certain project-related data and/or a certain front-end software module, and client stations 112 may then receive project-related data (and perhaps related instructions) from back-end platform 102 in response to such a request. As yet another possibility, back-end platform 102 may be configured to "push" certain types of project-related data to client stations 112, such as rendered two-dimensional or three-dimensional views, in which case client stations 112 may receive project-related data (and perhaps related instructions) from back-end platform 102 in this manner. As still another possibility, back-end platform 102 may be configured to make certain types of project-related data available via an API, a service, or the like, in which case client stations 112 may receive project-related data from back-end platform 102 by accessing such an API or subscribing to such a service. The interaction between client stations 112 and back-end platform 102 may take various other forms as well.

In practice, client stations 112 may each be operated by and/or otherwise associated with a different individual that is associated with a construction project. For example, an individual tasked with the responsibility for creating project-related data, such as data files defining three-dimensional models of a construction project, may access one of the client stations 112, whereas an individual tasked with the responsibility for reviewing and revising data files defining three-dimensional models of a construction project may access another client station 112, whereas an individual tasked with the responsibility for physically constructing the elements shown in the drawings, such as an on-site construction professional, may access yet another client station 112. Client stations 112 may be operated by and/or otherwise associated with individuals having various other roles with respect to a construction project as well. Further, while FIG. 1 shows an arrangement in which three particular client stations are communicatively coupled to back-end platform 102, it should be understood that a given arrangement may include more or fewer client stations.

Although not shown in FIG. 1, back-end platform 102 may also be configured to receive project-related data from one or more external data sources, such as an external database and/or another back-end platform or platforms. Such data sources—and the project-related data output by such data sources—may take various forms.

It should be understood that network configuration 100 is one example of a network configuration in which embodiments described herein may be implemented. Numerous other arrangements are possible and contemplated herein. For instance, other network configurations may include additional components not pictured and/or more or less of the pictured components.

II. EXAMPLE COMPUTING DEVICE

Figure 2:
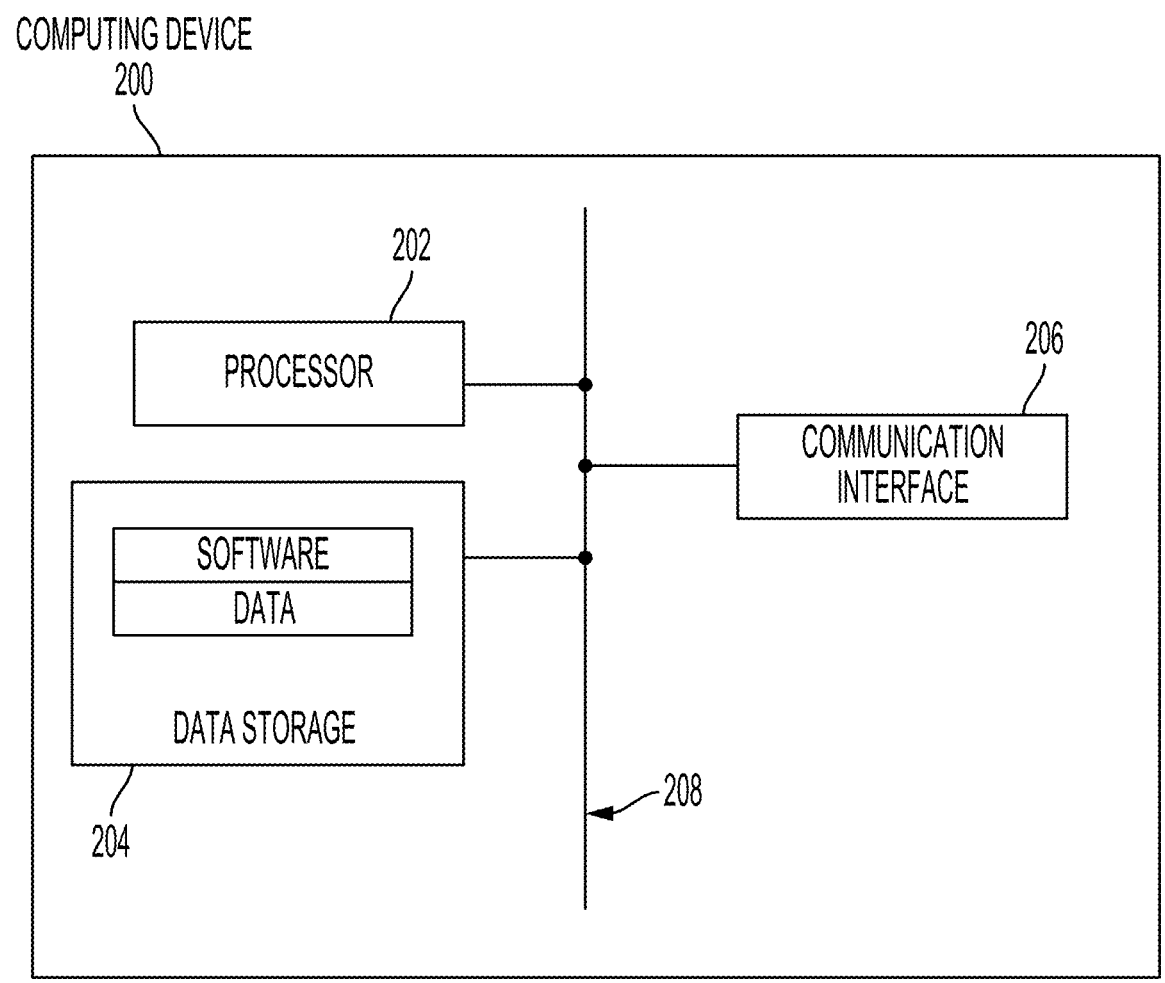
FIG. 2 depicts an example computing device that may be configured to carry out one or more of the functions of the present disclosure.

FIG. 2 is a simplified block diagram illustrating some structural components that may be included in an example computing device 200, which could serve as, for instance, the back-end platform 102 and/or one or more of client stations 112 in FIG. 1. In line with the discussion above, computing device 200 may generally include at least a processor 202, data storage 204, and a communication interface 206, all of which may be communicatively linked by a communication link 208 that may take the form of a system bus or some other connection mechanism.

The processor 202 may comprise one or more processor components, such as general-purpose processors (e.g., a single- or multi-core microprocessor), special-purpose processors (e.g., an application-specific integrated circuit or digital-signal processor), programmable logic devices (e.g., a field programmable gate array), controllers (e.g., microcontrollers), and/or any other processor components now known or later developed. In line with the discussion above, it should also be understood that the processor 202 could comprise processing components that are distributed across a plurality of physical computing devices connected via a network, such as a computing cluster of a public, private, or hybrid cloud.

In turn, the data storage 204 may comprise one or more non-transitory computer-readable storage mediums, examples of which may include volatile storage mediums such as random-access memory, registers, cache, etc. and non-volatile storage mediums such as read-only memory, a hard-disk drive, a solid-state drive, flash memory, an optical-storage device, etc. In line with the discussion above, it should also be understood that the data storage 204 may comprise computer-readable storage mediums that are distributed across a plurality of physical computing devices connected via a network, such as a storage cluster of a public, private, or hybrid cloud.

As shown in FIG. 2, the data storage 204 may be provisioned with software components that enable the platform 200 to carry out the platform-side functions disclosed herein. These software components may generally take the form of program instructions that are executable by the processor 202 to carry out the disclosed functions, which may be arranged together into software applications, virtual machines, software development kits, toolsets, or the like, all of which are referred to herein as a software tool or software tools. Further, the data storage 204 may be arranged to store project-related data in one or more databases, file systems, or the like. The data storage 204 may take other forms and/or store data in other manners as well.

The communication interface 206 may be configured to facilitate wireless and/or wired communication with other computing devices or systems, such as one or more client stations 112 when the computing device 200 serves as the back-end platform 102, or the back-end platform 102 when the computing device 200 serves as one of the client stations 112. Additionally, in an implementation where the computing device 200 comprises a plurality of physical computing devices connected via a network, the communication interface 206 may be configured to facilitate wireless and/or wired communication between these physical computing devices (e.g., between computing and storage clusters in a cloud network). As such, the communication interface 206 may take any suitable form for carrying out these functions, examples of which may include an Ethernet interface, a serial bus interface (e.g., Firewire, USB 3.0, etc.), a chipset and antenna adapted to facilitate wireless communication, and/or any other interface that provides for wireless and/or wired communication. The communication interface 206 may also include multiple communication interfaces of different types. Other configurations are possible as well.

Although not shown, the computing device 200 may additionally include one or more interfaces that provide connectivity with external user-interface equipment (sometimes referred to as "peripherals"), such as a keyboard, a mouse or trackpad, a display screen, a touch-sensitive interface, a stylus, a virtual-reality headset, speakers, etc., which may allow for direct user interaction with the computing device 200.

It should be understood that computing device 200 is one example of a computing device that may be used with the embodiments described herein. Numerous other arrangements are possible and contemplated herein. For instance, other computing devices may include additional components not pictured and/or more or fewer of the pictured components.

III. EXAMPLE TWO- AND THREE-DIMENSIONAL DRAWINGS

As mentioned above, one aspect of managing a construction project involves the creation, review, and sometimes revision, of plans for the construction project. The plans assist construction professionals in carrying out the construction project. For example, some plans include written statements, such a punch list or submittal log, which may communicate, for instance, what materials are needed during construction. Other plans may include visual representations of the construction project that visually communicate to the construction professionals how to assemble or construct the construction project.

Depending on the type of construction project, these visual representations tend to take one of two different forms. As one possibility, these visual representations may take the form of a set of two-dimensional technical drawings, such as architectural drawings, engineering plans, or construction blueprints, etc. From these two-dimensional technical drawings, the construction professionals can determine how to construct the project. As another possibility, these visual representations may take the form of a computerized, three-dimensional visual representation of the construction project. Construction professionals can use a corresponding software tool to review the three-dimensional visual representation, often in conjunction with a review of two-dimensional technical drawings, as an aid during the construction process. Set forth below is a short overview of each of these types of visual representations of construction projects.

A. Two-Dimensional Technical Drawings

As mentioned, one way to visually represent information about a construction project is through two-dimensional technical drawings. Generally, a two-dimensional technical drawing serves to visually communicate information about the construction project in order to aid in the construction, or the further design, of the project. For example, a two-dimensional technical drawing may take the form of an architectural floor plan of a building, which may visually communicate how the construction project is laid out. An architectural drawing may comprise a scaled drawing depicting certain structural elements of the construction project (e.g., floors, walls, ceilings, doorways, and support elements), with perhaps visual indications of additional relevant aspects of these structural elements, such as measurements, dimensions, materials, etc.

Another example of a two-dimensional technical drawing is a drawing that visually communicates how the heating, ventilation, and air conditioning (HVAC) ductwork is routed throughout the building. Like an architectural drawing, this schematic may visually communicate the HVAC ductwork routing through the use of a scaled depiction of the ductwork along with indications of other relevant aspects of the ductwork, such as measurements, dimensions, materials, etc. Other two-dimensional drawings, often but not necessarily corresponding to separate design aspects of the construction project are also possible, such as plumbing drawings, electrical drawings, fire protection drawings, and so on. In each case, the drawings may display a set of gridlines that can be used to provide a common reference from which a construction professional may lay out and construct the different elements of the construction project.

Because technical drawings such as these are limited to two dimensions, multiple technical drawings may be used when there is a need to visually communicate aspects from a third (e.g., vertical) dimension. For instance, a building in a construction project may comprise multiple floors and the design of the project may call for changes in the shape or structure of the building from floor to floor, in addition to changes in the routing, location, and sizing of utilities from floor to floor. Thus, there may be multiple technical drawings for each floor of a building in the construction project.

Similarly, the engineering design of the exterior site may include technical drawings corresponding to underground utilities, stormwater management and erosion control, site grading, roadway and paving design, landscaping plans, and other aspects which may be impractical to including in a single technical drawing. For these reasons, a single construction project may involve the use of tens, hundreds, or perhaps thousands of technical drawings. As noted above, the gridlines may be reflected on some or all of these two-dimensional drawings.

Generally, two-dimensional technical drawings, like the examples described above, are created at the outset of a construction project by architects, designers, engineers, or some combination thereof. Traditionally, these professionals would design such two-dimensional technical drawings by hand. But today, professionals typically design two-dimensional technical drawings with the aid of computer-assisted design (CAD) software, such as existing CAD software known and used by professionals in the industry.

Two-dimensional technical drawings have advantages. For instance, a single two-dimensional technical drawing can visually communicate large amounts of useful information. In some cases, construction professionals can get an overview of an entire area of a construction project by referring to a single technical drawing. Moreover, once completed and put into final form, technical drawings require a relatively small amount of computer storage and processing power to store and view. Construction professionals can often review finished technical drawings with off-the-shelf software document viewers, such as portable document format (PDF) software viewers.

Yet two dimensional technical drawings also have disadvantages. Because these technical drawings are typically created at the outset of the construction project—that is, well before physical construction has actually begun—these drawings generally will not reflect changes to the project that happen during, say, the construction phase. When a change to the construction project happens after the technical drawings are completed, architects, designers, or engineers may be called upon to revise the existing technical drawings or create new drawings altogether to reflect the change.

Additionally, technical drawings that are generated at the outset of the construction project may not always visually communicate the specific information desired by the construction professional who later accesses the technical drawings. For instance, during construction, a construction professional may determine that it would be useful to have a technical drawing that shows the location, on an interior wall that has just been installed, where a plumbing pipe designed to pass through the wall (but net yet installed) will eventually intersect that wall. However, a technical drawing showing these particular dimensions may not exist. Thus, the construction professional may have to wait for, or go without, his or her desired technical drawing. One solution to this issue would be to call upon an engineer, designer, or architect to generate the technical drawings with the requested information. But this is often a costly and time-consuming process, which may not be feasible depending on the project's budget as well as the stage of construction.

B. Three-Dimensional Visual Representations

Another way to visually represent information about a construction project is through a computerized, three-dimensional model of the construction project. In order to facilitate the creation and use of a computerized, three-dimensional model of the construction project, a team of architects, designers, and/or engineers engages in a process referred to as Building Information Modeling.

As a general matter, Building Information Modeling refers to the process of designing and maintaining a computerized representation of physical and functional characteristics of a construction project, such as a building. Specialized software tools can then access this computerized representation and process it to visually communicate how to construct the building via a navigable, three-dimensional model of the building and its infrastructure.

More specifically, but still by way of example, when architects, designers, and/or engineers engage in Building Information Modeling for a specific construction project, they generally produce what is referred to as a Building Information Model (BIM) file. In essence, a BIM file is a computerized description of the individual physical elements that comprise the construction project, such as the physical structure of the building, including walls, floors, and ceilings, as well as the building's infrastructure, including pipes, ducts, conduits, etc. This computerized description can include a vast amount of data describing the individual physical elements of the construction project and the relationships between these individual physical elements, including for instance, the relative size and shape of each element, and an indication of where each element will reside in relation to the other elements in the construction project.

BIM files can exist in one or more proprietary or open-source computer-file formats and are accessible by a range of specialized software tools. One type of specialized software tool that can access BIM files is referred to as a "BIM viewer." A BIM viewer is software that accesses the information contained within a BIM file or a combination of BIM files for a particular construction project and then, based on the file(s), is configured to cause a computing device to render a three-dimensional view of the computerized representation of the construction project. This view is referred to herein as a "three-dimensional visualization of a three-dimensional model of a construction project" or simply a "three-dimensional visualization."

In order for BIM viewer software to be able to cause a computing device to render a three-dimensional visualization of the three-dimensional project of the construction project, BIM files typically contain data that describes the attributes of each individual physical element (e.g., the walls, floors, ceilings, pipes, ducts, etc.) of the construction project. For instance, for an air duct designed to run across the first-floor ceiling of a building, a BIM file for the building may contain data describing how wide, how long, how high, and where, in relation to the other individual physical elements of the construction project, the duct is positioned.

There are many ways for BIM files to arrange and store data that describes the attributes of the individual physical elements of a construction project. In one specific example, BIM files may contain data that represents each individual physical component in the construction project, such as a pipe, as a mesh of geometric triangles (e.g., a triangular irregular network, or TIN) such that when the geometric triangles are visually stitched together by BIM viewer software, the triangles form a mesh or surface, which represents a scaled model of the physical component. In this respect, the BIM file may contain data that represents each triangle of a given mesh as a set of coordinates in three-dimensional space ("three-space"). For instance, for each triangle stored in the BIM file, the BIM file may contain data describing the coordinates of each vertex of the triangle (e.g., an x-coordinate, a y-coordinate, and a z-coordinate for the first vertex of the triangle; an x-coordinate, a y-coordinate, and a z-coordinate for the second vertex of the triangle; and an x-coordinate, a y-coordinate, and a z-coordinate for the third vertex of the triangle). A given mesh may be comprised of thousands, tens of thousands, or even hundreds of thousands of individual triangles, where each triangle may have a respective set of three vertices and corresponding sets of three-space coordinates for those vertices. However, other ways for a BIM file to contain data that represents each individual physical component in a construction project are possible as well.

BIM files may also include data describing other attributes of the individual physical elements of the construction project that may or may not be related to the element's specific position. By way of example, this may include data describing what system or sub-system the component is associated with (e.g., structural, plumbing, HVAC, electrical, etc.), data describing what material or materials the individual physical element is made of; what manufacturer the element comes from; where the element currently resides (e.g., data indicating that the element is on a truck for delivery to the construction site, and/or once delivered, data indicating where on the construction site the delivered element resides); and/or various identification numbers assigned to the element (e.g., a serial number, part number, model number, tracking number, etc.), as well as others.

Together, these other attributes are generally referred to as metadata. BIM viewer software may utilize this metadata in various ways. For instance, some BIM viewer software may be configured to present different views based on selected metadata (e.g., displaying all representations of HVAC components but hiding all representations of plumbing components; and/or displaying representations of metal components in a certain color and displaying representations of wood components in another color, etc.).

As mentioned, BIM viewer software is generally deployed on client stations, such as the client stations 112 of FIG. 1 (which, as described above, can generally take the form of a desktop computer, a laptop, a tablet, or the like). As such, construction professionals can utilize BIM viewer software during all phases of the construction project and can access a BIM file for a particular construction project in an office setting as well as on the construction site. Accordingly, BIM viewer software assists construction professionals with, among other things, the design and construction of the project and/or to identify issues that may arise during such construction.

In some instances, it may be desirable for a construction professional to view a limited portion of a three-dimensional visualization of a three-dimensional model of a construction project. For example, a construction professional may desire to view a given room on a given floor of the construction project without the noise of surrounding areas, which can be considerable due to the amount of information that may be included in the BIM file. Current technology may enable the construction professional to hide representations of certain components of the construction project, as described, but does not provide a convenient method for removing entire areas of the three-dimensional visualization from the displayed view. In particular, current solutions for removing sections of three-dimensional visualizations of three-dimensional models of construction projects are non-intuitive, limited in their functionality, and fail to provide a smooth experience to enable construction professionals to cut away portions of the three-dimensional view to isolate a desired area of the three-dimensional visualization for viewing.

IV. EXAMPLE OPERATIONS

Disclosed herein is new software technology that is designed to help remedy some of the aforementioned limitations by enabling construction professionals to flexibly and intuitively "cut" a visualization of a 3D model along a desired cross section (e.g., along a specific plane, at a specific location, etc.) to thereby remove entire areas of the 3D model from the displayed visualization, leaving the isolated area of interest. For instance, disclosed herein is software technology that provides a sectioning control tool comprising an idealized three-dimensional model of a three-dimensional visualization of a three-dimensional model of a construction project to enable user-friendly functionality for adjusting the view of the three-dimensional visualization, such as by enabling a user to cut away portions of the three-dimensional visualization from the view.

Example operations that may be carried out by one or more computing devices running the disclosed software technology are discussed in further detail below. For purposes of illustration only, these example operations are described as being carried out by a computing device, such as the computing device 200 of FIG. 2. As described above, the computing device 200 may serve as one or more of the client stations 112 and/or the back-end platform 102 shown in FIG. 1. In this respect, it should be understood that, depending on the implementation, the operations discussed below may be carried out entirely by a single computing device, such as one or more of the client stations 112 or by the back-end platform 102, or may be carried out by a combination of computing devices, with some operations being carried out by the back-end platform 102 (such as computational processes and data-access operations) and other operations being carried out by one or more of the client stations 112 (such as display operations and operations that receive user inputs). However, other arrangements are possible as well.

Figure 3:
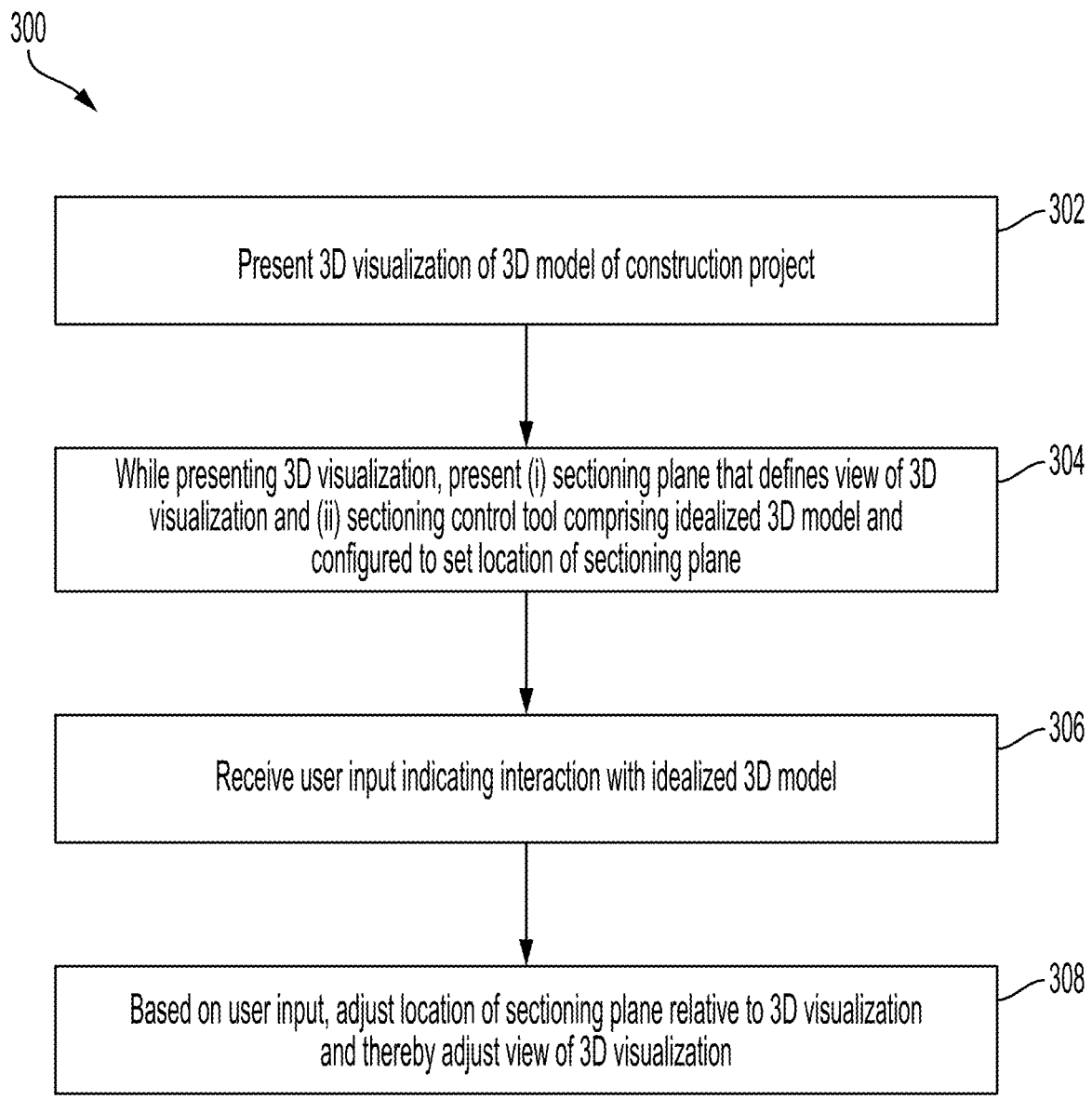
FIG. 3 is a flowchart that illustrates various operations that may be carried out by a computing device, according to the present disclosure.

FIG. 3 is a flowchart 300 that illustrates various operations that may be carried out by the computing device 200, according to the present disclosure.

Beginning at block 302, the computing device 200 may present, via a graphical user interface (GUI) of a BIM viewer software application running on the computing device 200, a three-dimensional (3D) visualization of a 3D model of a construction project. As previously described, the construction project may comprise a building and its related infrastructure, although in practice the construction project may take any of various other forms. Further, the 3D model may comprise the computerized representation of the construction project as previously described, including computerized descriptions of the individual physical elements that comprise the construction project.

Figure 4:
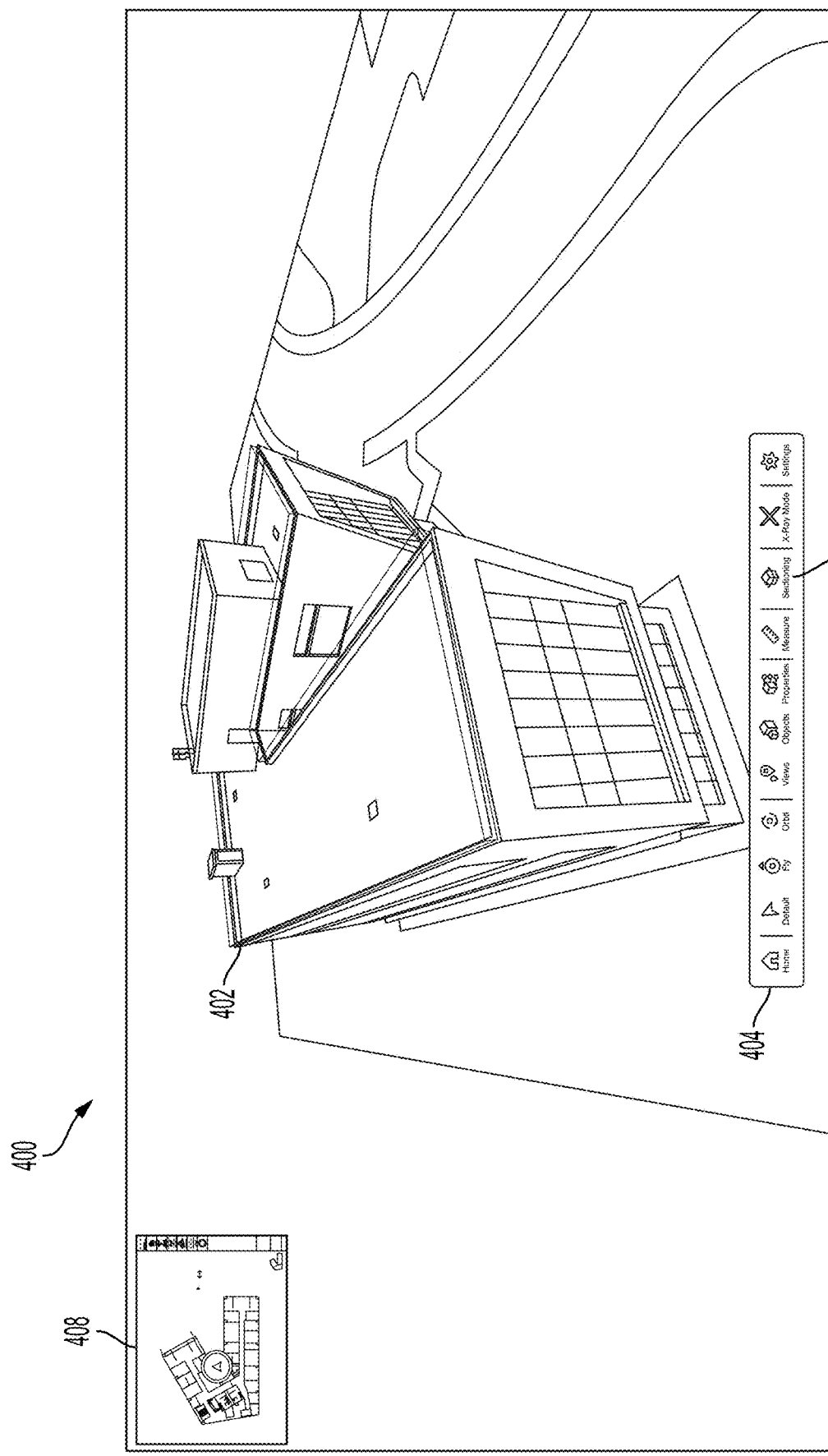
FIG. 4 illustrates an example view of a 3D model that may be presented via a graphical user interface (GUI) of a BIM viewer software application using a sectioning control tool, according to the present disclosure.

FIG. 4 illustrates an example view 400 that may be presented via the GUI of the BIM viewer software application running on the computing device 200. As shown, the example view 400 may include a 3D visualization 402 of a 3D model of a construction project. As may be appreciated, the 3D visualization 402 may include various components (e.g., physical elements) to describe the construction project in detail, so as to enable construction professionals to utilize the 3D visualization 402 in planning and executing operations associated with the construction project.

As shown, the example view 400 may include a two-dimensional (2D) visualization 408 of a 2D model of the construction project. As shown, the 2D visualization 408 illustrates a top-down view of the 3D model of the construction project and may take the form of a 2D technical drawing (e.g., an architectural floor plan) for the construction project. In practice, any 2D view of the 3D model of the construction project may be shown via the 2D visualization 408. As described in greater detail below, the 2D visualization 408 may enable various functionality of the BIM viewer application that may be utilized to provide insight into the construction project.

Further, as shown, the example view 400 may include a toolbar 404. The toolbar may enable various functionality of the BIM viewer software application running on the computing device 200, such as navigational features for a user to maneuver the 3D visualization 402. Such features may include (i) returning to a "default" view of the 3D visualization, (ii) "flying" around the 3D visualization (e.g., by adjusting a viewpoint of the 3D visualization), (iii) "orbiting" around the 3D visualization (e.g., by rotating the view of the 3D visualization), (iv) selecting or saving various views of the 3D visualization, (v) selecting or saving various objects within the 3D visualization, (vi) selecting various properties of the construction project to show/hide in the 3D visualization, (vii) measuring various aspects of the 3D visualization, (viii) viewing the 3D visualization in an "x-ray" mode (e.g., by hiding some surfaces/structures from view), and (ix) opening a settings menu of the 3D visualization, among various other possibilities.

In addition to the various features enabled by the toolbar 404, the toolbar 404 may also advantageously include a selectable icon 406 for a sectioning tool that may, when selected by a user of the BIM viewer software, cause sectioning tool functionality for the BIM viewer software application to be displayed.

Returning again to FIG. 3, at block 304, while presenting the 3D visualization of the 3D model of the construction project, the computing device 200 may also present (i) a sectioning plane that defines a view of the 3D visualization of the 3D model of the construction project and (ii) a sectioning control tool that includes an idealized 3D model of the construction project and is configured to set a location of the sectioning plane relative to the 3D visualization. In this regard, it should be noted that although various features and examples may be described herein with respect to a single sectioning plane, any feature described with respect to one sectioning plane may be applicable to multiple sectioning planes. For example, the computing device 200 may, via the GUI of the viewer BIM software application running on the computing device 200, present more than one sectioning plane to define the view of the 3D visualization.

The computing device 200 may be configured to present the sectioning plane and sectioning control tool at any of various times, and according to any of various trigger events. As one possibility, the computing device 200 may be configured to present one or both of the sectioning plane and sectioning control tool based on receiving an input indicating an interaction with the BIM viewer software application, such as a user selecting the selectable icon 406. As another possibility, the computing device 200 may be configured to present the sectioning plane and/or the sectioning control tool as a default view, such that when the GUI of the BIM viewer software application running on the computing device 200 is first presented via the computing device 200, one or both of the sectioning control tool and the sectioning plane are presented via the GUI. Other possibilities may also exist.

Figure 5:
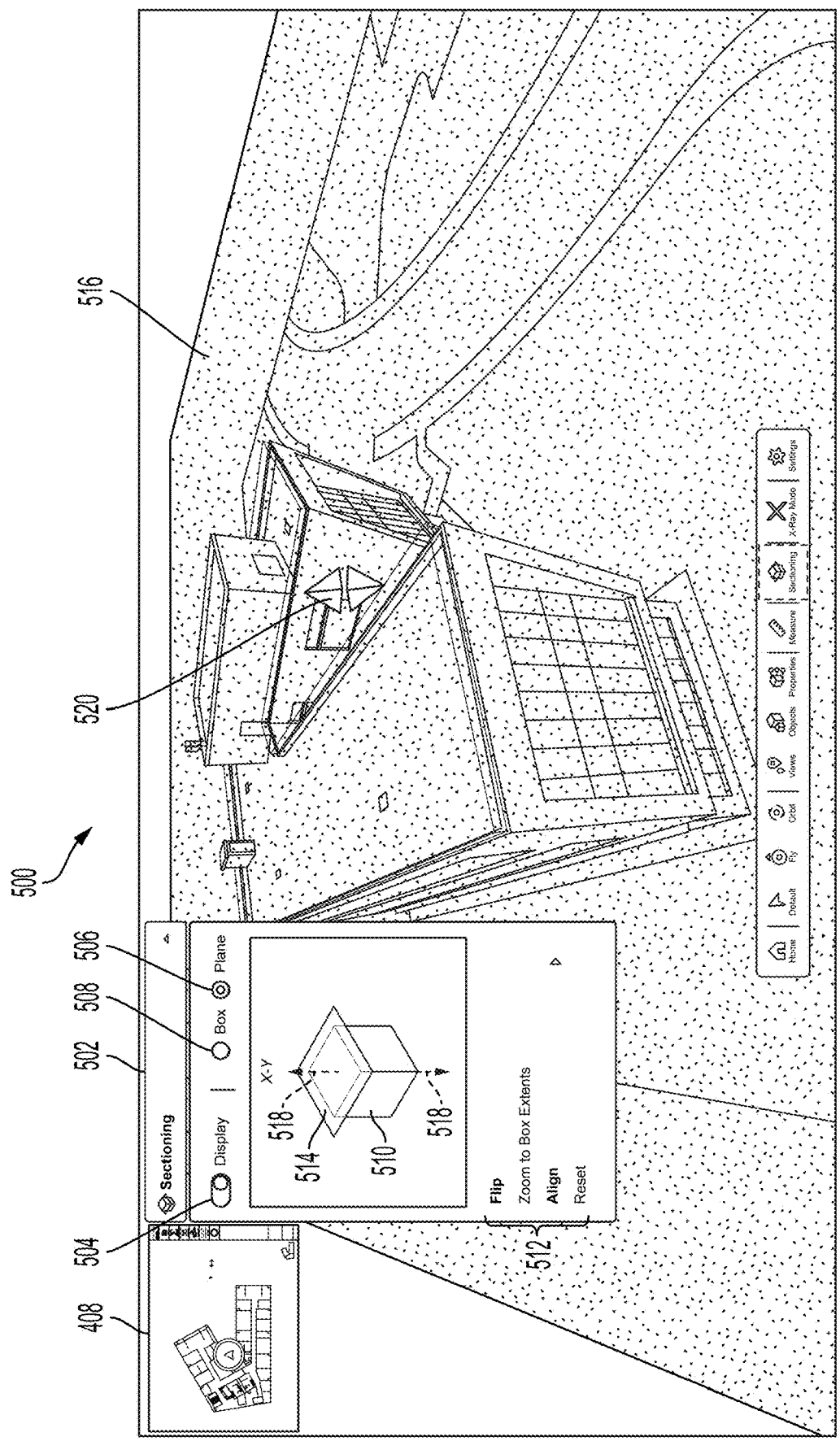
FIG. 5 illustrates an example view of a 3D model that may be presented via a GUI of a BIM viewer software application using a sectioning control tool, according to the present disclosure.

To illustrate the sectioning plane and sectioning control tool, FIG. 5 includes an example view 500 that may be presented via the GUI of the BIM viewer software application running on the computing device 200. As shown, the example view 500 includes a sectioning control tool 502 that may include various sub-components, one example being a display toggle 504. In practice, the display toggle 504 may enable the user of the computing device 200 to select between displaying or hiding some or all of the sectioning control tool 502. As one example, when the display toggle 504 is enabled, the sectioning control tool 502 may be presented on the example view 500 via the GUI of the BIM viewer software application. Alternatively, when the display toggle 504 is disabled, the computing device 200 may cease presenting the sectioning control tool 502 via the GUI of the BIM viewer software application.

As another example, when the display toggle 504 is enabled, a portion of the sectioning control tool 502 (e.g., an idealized 3D model of the sectioning control tool 502 or some other portion of the sectioning control tool 502) may be presented within the sectioning control tool 502 via the GUI of the BIM viewer software application running on the computing device 200. Alternatively, when the display toggle 504 is disabled, the computing device 200 may cease presenting the portion of the sectioning control tool 502 via the GUI of the BIM viewer software application. Other possible features of the display toggle 504 may also exist.

Other sub-elements of the sectioning control tool 502 may include a plane selectable icon 506 and a box selectable icon 508, which enable "plane" and "box" functionality (described further below), respectively. For instance, the example view 500 is an example of a view that may be presented via the GUI of the BIM viewer software application when the plane selectable icon 506 is selected. As described herein, other views may be presented via the GUI of the BIM viewer software application, such as when the box selectable icon 508 is selected.

Yet another sub-element of the sectioning control tool 502 may be an idealized 3D model 510 of the 3D visualization 402, which may, in at least some implementations, be the component of the sectioning control tool 502 that is presented/hidden via selection of the display toggle 504, as previously described. As shown in the example view 500, the idealized 3D model 510 takes the shape of a cube, although in practice, the idealized 3D model 510 may take any shape.

The idealized 3D model 510 may enable the user of the BIM viewer software application to view only a portion of the 3D visualization 402, while removing other portions of the 3D visualization 402 from view. In practice, this may be accomplished in various ways.

As one example, the idealized 3D model 510 may enable the user of the BIM viewer software application to view only a portion of the 3D visualization 402 via an idealized sectioning plane 514 that may correspond to a sectioning plane 516 positioned relative to the 3D visualization 402. As shown, and perhaps as a default setting, the idealized sectioning plane 514 may be positioned on a top surface of the idealized 3D model 510, in the X-Y plane. The sectioning plane 516 may be similarly positioned above the 3D visualization 402 in the X-Y plane of the 3D model. However, in some implementations, the idealized sectioning plane 514 and the sectioning plane 516 may be positioned in a different plane by default (e.g., in the X-Z plane or the Y-Z plane). Regardless, the idealized sectioning plane 514 may be positioned relative to the idealized 3D model 510 in a manner than corresponds to the position of the sectioning plane 516 relative to the 3D visualization 402. Further, as described herein, movement of the idealized sectioning plane 514 relative to the idealized 3D model 510 may track movement of the sectioning plane 516 relative to the 3D visualization 402, and vice versa.

In practice, the sectioning plane 516 may define a view of the 3D visualization 402 by "cutting" the 3D visualization wherever it intersects the 3D model, such that everything on one side of the sectioning plane 516 is removed from view. This may enable the user of the BIM viewer software application to view only a portion of the 3D visualization 402. For example, a sectioning plane 516 beginning at a bounding edge of the 3D visualization, as shown in FIG. 5, may remove portions of the 3D visualization 402 from view that are above the sectioning plane 516 as it is lowered. Other examples are also possible.

There may be various other manners in which the idealized 3D model 510 may enable the user of the BIM viewer software application to view only a portion of the 3D visualization 402, some of which are described in greater detail herein with respect to "box" functionality enabled via the sectioning control tool 502. Further, there may be various other possible features of the BIM viewer software application running on the computing device 200 that may be enabled by the idealized 3D model 510.

Returning again to FIG. 3, at block 306, the computing device 200 may receive a user input from the user of the computing device 200 that indicates an interaction with the idealized 3D model of the sectioning control tool.

Figure 7:
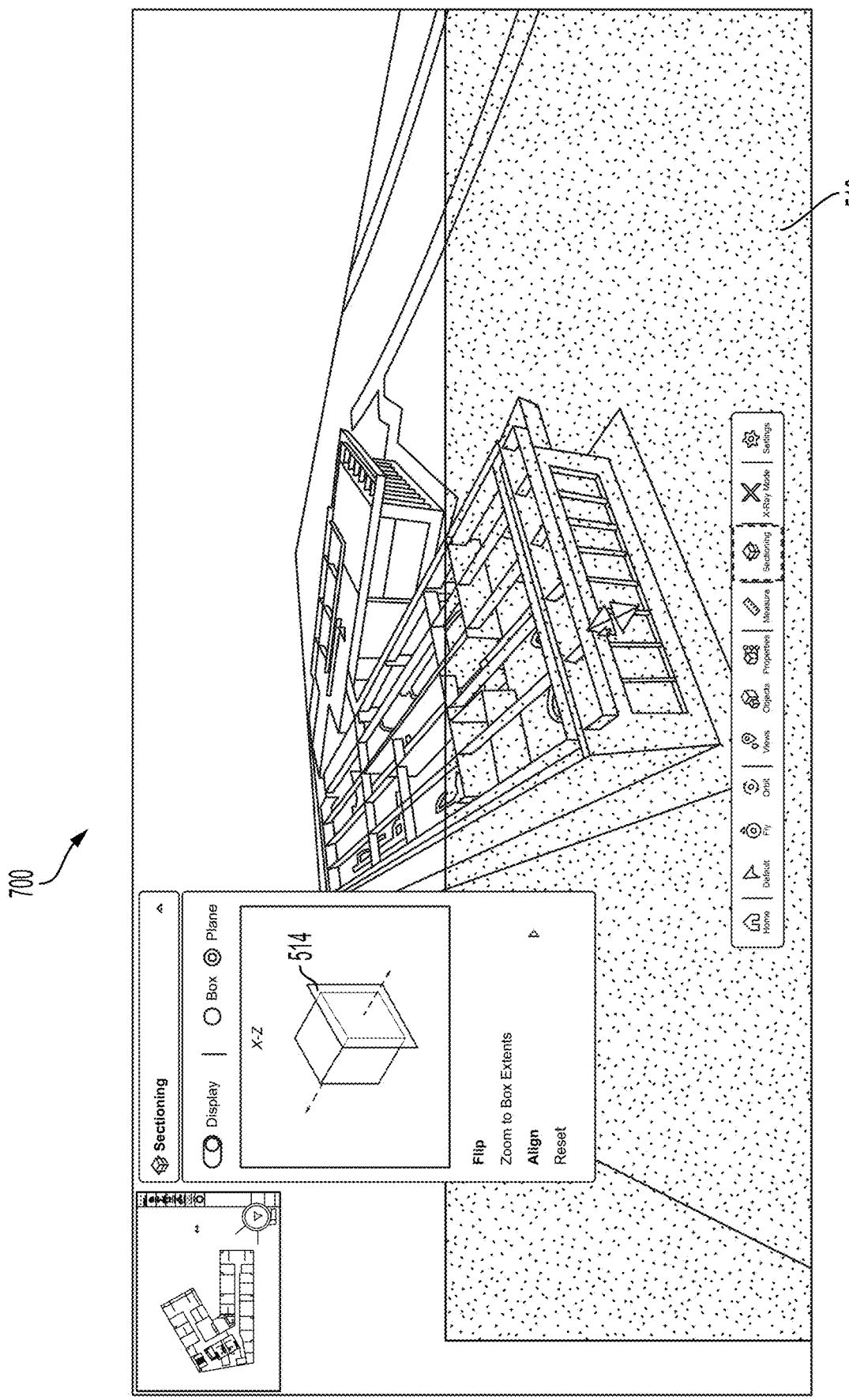
FIG. 7 illustrates another example view that may be presented via a GUI of a BIM viewer software application using a sectioning control tool, according to the present disclosure.

As may be appreciated, there may be various manners in which the user of the computing device 200 may interact with the idealized 3D model 510 of the sectioning control tool 502. As one possibility, the user of the computing device 200 may interact with the idealized 3D model 510 via selection of a surface of the idealized 3D model 510. For example, the idealized 3D model 510, taking the shape of a cube, may comprise 6 surfaces, any of which may be selectable by the user of the computing device 200, and which may in turn adjust the orientation of the idealized sectioning plane 514 and the sectioning plane 516 (as shown in FIG. 7). In some implementations, surfaces of the idealized 3D model 510 that are not visible (e.g., due to the 3D nature of the idealized 3D model 510) may nonetheless be selectable, for example via selection of the "flip" selectable icon of a set of selectable icons 512, which may cause a surface to be selected that is opposite a currently selected surface. For example, selecting the "flip" selectable icon while a top surface of the idealized 3D model 510 is selected may cause a bottom surface of the idealized 3D model 510 to be selected. In addition, selection of the "flip" selectable icon may reverse which side of the sectioning plane 516 is removed from view and which side remains part of the visualization. In some implementations, selection of the "flip" selectable icon may also cause an orientation of the 3D visualization 402 to adjust in a corresponding manner. Alternatively, in at least some implementations, "flipping" the selected surface of the idealized 3D model 510 may not cause the 3D visualization 402 to flip.

As another possibility, the user of the computing device 200 may interact with the idealized 3D model 510 via movement of the idealized sectioning plane 514 relative to the idealized 3D model 510. In practice, the user of the computing device 200 may interact with the sectioning plane 514 to move it relative to the idealized 3D model 510 in various ways. As one example, the user may click and drag the idealized sectioning plane 514 to slide the idealized sectioning plane 514 through the idealized 3D model 510 vertically along the Z-axis. As another example, the user may select a navigation arrow 518 of the idealized 3D model 510 to move the idealized sectioning plane 514 up or down along the Z-axis in the direction indicated by the navigation arrow 518. In some implementations, the navigation arrow 518 may by bidirectional, such that the user may move the idealized sectioning plane 514 in either direction along the Z axis by selecting respective portions of the navigation arrow 518 (e.g., an "upward" portion and a "downward" portion). In this regard, it will be understood that movement of the idealized sectioning plane 514 may follow a similar convention if a different surface of the idealized 3D model 510 is selected (e.g., an idealized sectioning plane 514 in the X-Z plane moving along the Y-axis, etc.).

In practice, various other user interactions with the idealized 3D model 510 may also be possible. Further, in implementations where multiple sectioning planes (and accordingly multiple idealized sectioning planes) are being presented via the GUI of the BIM viewer software application, the sectioning control tool 502 may facilitate user interactions with any of the presented idealized sectioning planes.

Returning to FIG. 3, at block 308, the computing device 200 may, based on the user input, adjust the location of the sectioning plane relative to the 3D visualization, and thereby adjust the view of the 3D visualization.

For example, in implementations where a user input indicates a selection of a surface of the idealized 3D model 510, the computing device 200 may adjust the location of the sectioning plane 516 relative to the 3D visualization 402 in a manner that corresponds to the selected surface of the idealized 3D model 510. As one example, if the user input indicates a selection of a top surface (e.g., the X-Y plane) of the idealized 3D model 510 and the sectioning plane 516 was previously in a different orientation (e.g., in a different plane such as the X-Z plane), then, upon receipt of the user input, the computing device 200 may adjust the location of the sectioning plane 516 to be positioned in the X-Y plane of the 3D visualization 402. As another example, if the user input indicates a selection of a top surface of the idealized 3D model 510, and the sectioning plane 516 was not previously presented, then, upon receipt of the user input, the computing device 200 may cause the sectioning plane 516 to be presented in the X-Y plane of the 3D visualization 402.

Additionally, the computing device 200 may adjust the location of the idealized sectioning plane 514 relative to the idealized 3D model 510 based on the user input selecting the surface of the idealized 3D model 510. For instance, if the idealized 3D model 510 did not previously show the idealized sectioning plane 514, then, upon receiving the user input indicating the selection of a surface of the idealized 3D model 510 (e.g., the top surface), then the computing device 200 may present the idealized sectioning plane 514 along the selected surface of the idealized 3D model 510. Alternatively, if the idealized sectioning plane 514 was previously positioned at a different location relative to the idealized 3D model 510, then, upon receiving the user input selecting a surface of the idealized 3D model 510 (e.g., the top surface), the computing device 200 may adjust the location of the idealized sectioning plane 514 to be positioned on the selected surface of the idealized 3D model 510.

Further, in implementations where a user input indicates a movement of the idealized sectioning plane 514 relative to the idealized 3D model 510, the computing device 200 may adjust the location of the sectioning plane 516 relative to the 3D visualization 402 in a manner that corresponds to the movement of the idealized sectioning plane 514 relative to the idealized 3D model 510. As previously described, such user interaction may take any of various forms, including clicking and dragging the idealized sectioning plane 514 through the idealized 3D model 510 or selecting the navigation arrow 518, among various other possibilities.

Further, in addition to adjusting the location of the sectioning plane 516 based on user interaction with the idealized 3D model 510, the computing device 200 may adjust the location of the sectioning plane 516 based on other user input as well. Such user input may include interaction with the sectioning plane 516 itself, user interaction with a navigation arrow 520 of the sectioning plane 516, user interaction with a 2D sectioning line of the 2D visualization 408, or user interaction with a physical element of the 3D visualization 402 (e.g., to align the sectioning plane 516 with the physical element of the 3D visualization 402), among various other possibilities. Each of these additional types of user input are described in greater detail below.

Figure 6:
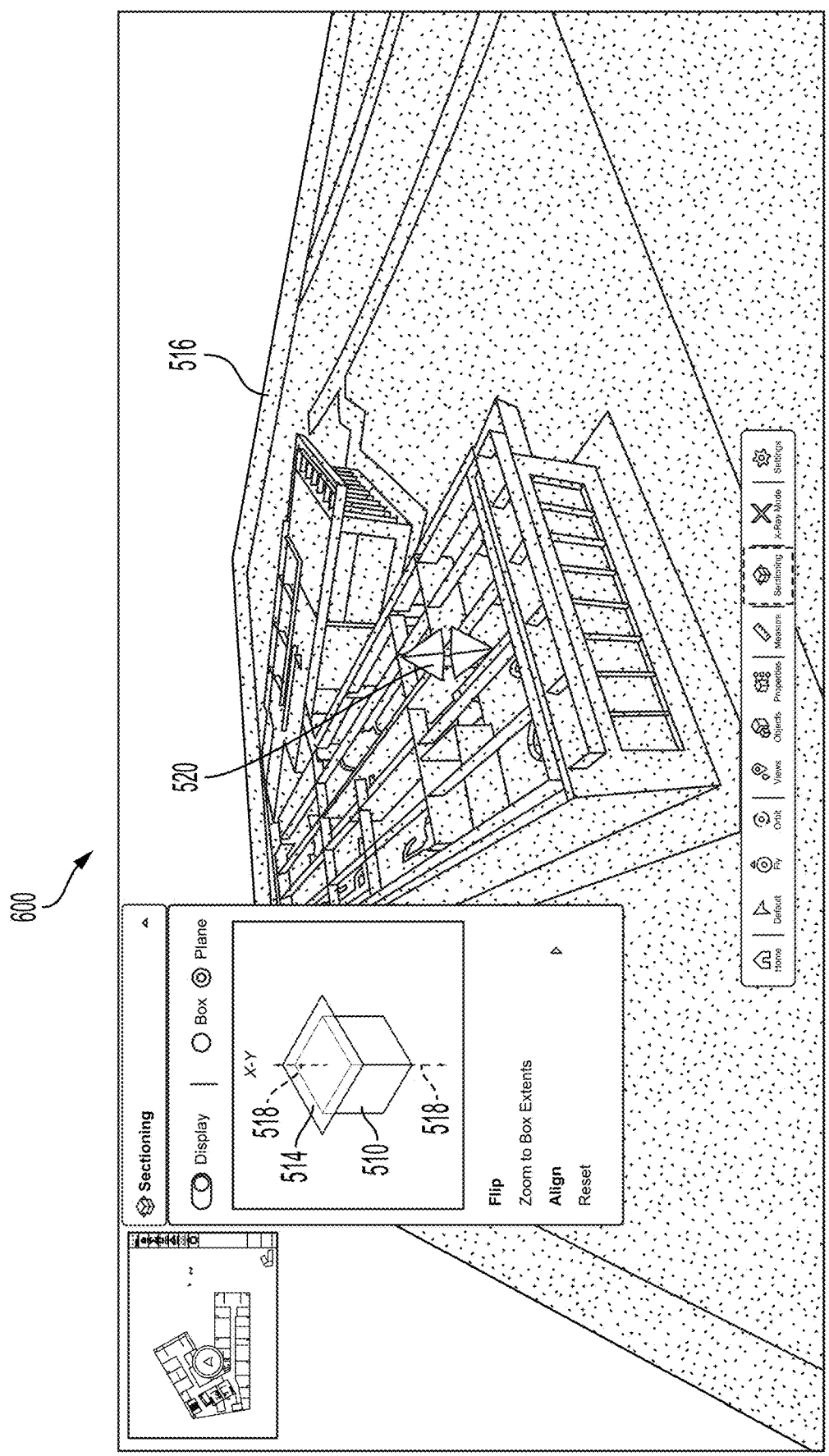
FIG. 6 illustrates another example view of a 3D model that may be presented via a GUI of a BIM viewer software application using a sectioning control tool, according to the present disclosure.

FIG. 6 illustrates an example view 600 that may be presented via the GUI of the BIM viewer software application running on the computing device 200, showing a view of the 3D visualization 402 that has a top portion removed by the sectioning plane 516. For instance, the example view shown in FIG. 6 removes everything above the second floor of the building. This view may be useful, for instance, to a construction professional who wants to see all of the physical elements within this particular cross section of the building, which may otherwise be difficult if the entire 3D model were still displayed.

As previously described, the view of the 3D visualization 402 may be adjusted based on movement of the sectioning plane 516, which, as shown in FIG. 6 has moved downward along the Z-axis (e.g., in relation to the 3D visualization 402 as shown in FIG. 5). Accordingly, the computing device 200 may remove a top portion of the 3D visualization 402 (i.e., the portion of the 3D visualization 402 that is between the sectioning plane's previous position in FIG. 5 and the sectioning plane's current position in FIG. 6) from the view. In practice, the movements of the sectioning plane 516, the idealized sectioning plane 514, etc., may be presented as a continuous movement from one location to another, and the removal of portions of the 3D visualization 402 may similarly be rendered by the computing device 200 in a continuous manner. This may provide the user of the computing device 200 with a better picture of what effect certain user interactions have in the presentation of the 3D visualization 402, and thus a high degree of control for adjusting the view.

As previously described, the movement of the sectioning plane 516 may be triggered in various ways, such as based on user input indicating an interaction with the idealized sectioning plane 514 of the idealized 3D model 510 (e.g., clicking and dragging the idealized sectioning plane 514 downward along the Z-axis relative to the idealized 3D model 510), an interaction with the navigation arrow 518 of the idealized 3D model 510 (e.g., selecting the bottom portion of the navigation arrow 518), an interaction with the sectioning plane 516 (e.g., clicking and dragging the sectioning plane 516 downward along the Z-axis relative to the 3D visualization 402), or an interaction with the navigation arrow 520 of the sectioning plane 516, among various other possibilities.

FIG. 7 illustrates another example view 700 that may be presented via the GUI of the BIM viewer software application running on the computing device 200 where the sectioning plane 516 has been repositioned from the X-Y plane, as in FIG. 6, to the X-Z plane, as shown in FIG. 7.

In an implementation illustrated by the example view 700, the computing device 200 may receive user input indicating a user interaction with the idealized 3D model 510 comprising a selection of the right-most X-Z surface of the idealized model 510. Based on the received user input, the computing device 200 may perform various operations. As a first operation, the computing device 200 may stop presenting the idealized sectioning plane 514 along the top X-Y plane of the idealized 3D model 510 and begin presenting the idealized sectioning plane 514 along the X-Z plane of the idealized 3D model 510. As a second operation, the computing device 200 may stop presenting the sectioning plane 516 along the X-Y plane of the 3D visualization 402 (as shown in FIG. 6) and begin presenting the sectioning plane 516 along the X-Z plane of the 3D visualization 402. The computing device 200 may perform various other operations as well based on the received user input selecting the right-most surface of the idealized model 510.

Further, in some implementations, the computing device 200 may perform some of the described operations in whole or in part. For example, the computing device 200 may present a sectioning plane and an idealized sectioning plane in new location(s) based on received user input without removing from view the sectioning plane and idealized sectioning plane from their previous locations, respectively. Accordingly, multiple sectioning planes and multiple idealized sectioning planes may be present on the 3D visualization 402 and the idealized 3D model 510, respectively.

Figure 8:
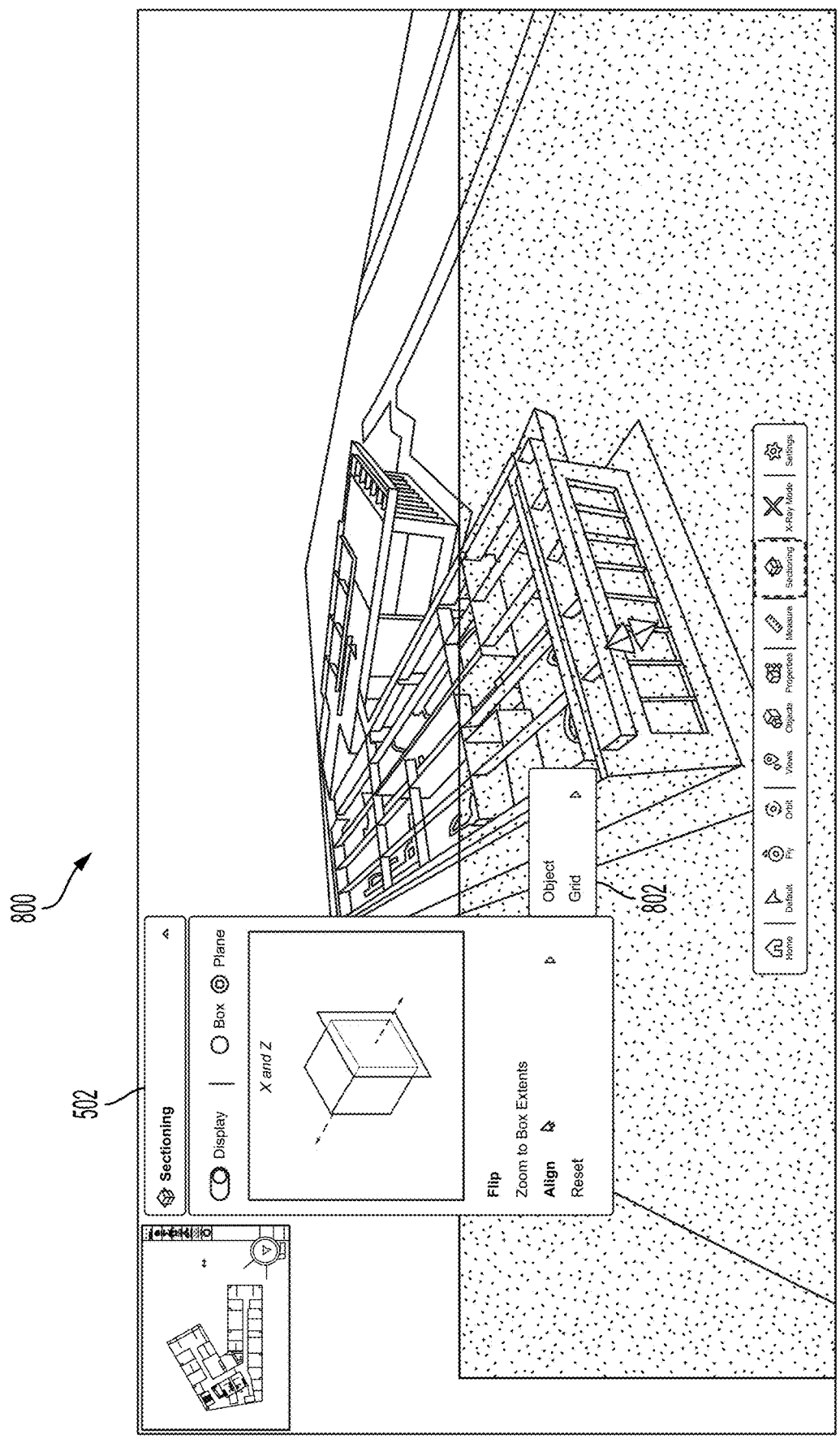
FIG. 8 illustrates another example view that may be presented via a GUI of a BIM viewer software application using a sectioning control tool, according to the present disclosure.
Figure 9:
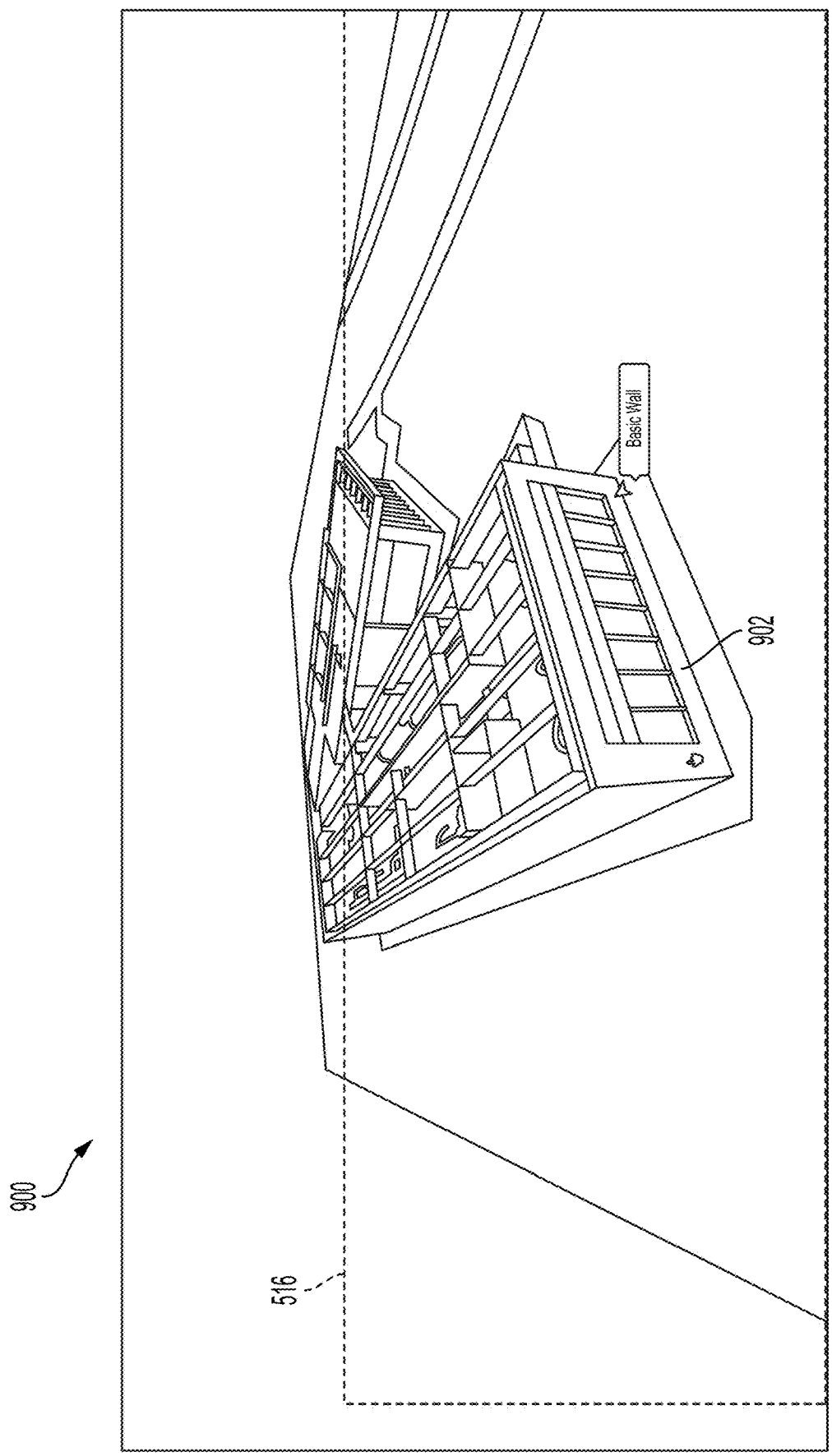
FIG. 9 illustrates another example view that may be presented via a GUI of a BIM viewer software application using a sectioning control tool, according to the present disclosure.
Figure 10:
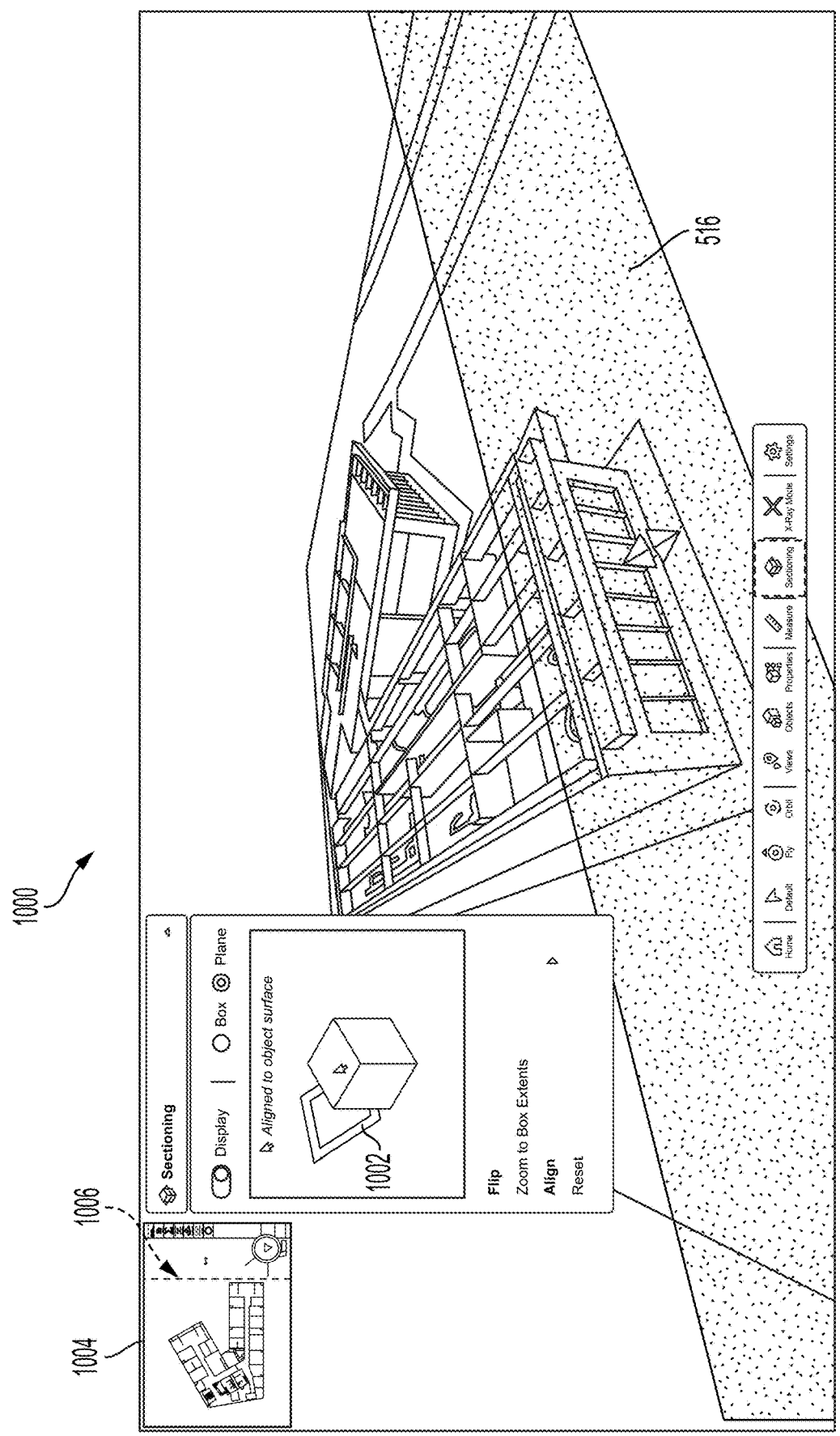
FIG. 10 illustrates another example view that may be presented via a GUI of a BIM viewer software application using a sectioning control tool, according to the present disclosure.

FIGS. 8-10 illustrate one possible manner in which a user may align a sectioning plane to a physical element (e.g., a surface) of the 3D model shown in the 3D visualization 402. Beginning with FIG. 8, an example view 800 is shown, which may be presented via the GUI of the BIM viewer software application running on the computing device 200. The example view 800 shows an instance of the sectioning control tool 502 where a selectable icon labeled "Align" from the set of selectable icons 512 has been selected by a user. Upon selection of the "Align" selectable icon, the sectioning control tool 502 may expand to include an align section 802. As shown, the align section 802 includes selectable icons for object-based alignment and grid-based alignment, which may each allow for different alignment functionality. For example, the grid-based alignment may enable the user to align a sectioning plane according to a set of gridlines that may be included within the 3D model of the construction project, which may be presented upon selection of the "Grid" option. The "Object" option, on the other hand, may enable the user to align a sectioning plane with a physical element of the 3D model shown in the 3D visualization 402.

Turning to FIG. 9, an example view 900 is shown that may be presented via the GUI of the BIM viewer software application after a user selects the object-based alignment selectable icon in the align section 802 as shown in FIG. 8. For example, upon selection of the object-based alignment selectable icon, the GUI of the BIM viewer software application running on the computing device 200 may optionally stop presenting the sectioning control tool 502, thereby providing the user with an unobstructed view of the 3D visualization 402. At this point, the user may select from various physical elements of the 3D visualization 402. For example, in some implementations, when the user hovers a mouse arrow or other selection tool over a physical element of the 3D model, the physical element may be highlighted, and a sectioning plane that is aligned with the highlighted physical element may be indicated (e.g., via dashed lines). As shown, the example view 900 includes a physical element 902 that a user may hover over, resulting in (i) the physical element 902 being highlighted and (ii) the sectioning plane 516 that is to be repositioned to align with the highlighted physical element 902 being presented with dashed lines. In some implementations, a textual descriptor for the physical element 902 may also be presented, such as the "Basic Wall" textual descriptor shown in FIG. 9.

Continuing the present example, FIG. 10 includes an example view 1000 that may be presented via the GUI of the BIM viewer software application after a user selects the physical element 902, as shown in FIG. 9. Upon selection of the physical element 902, the sectioning plane 516 may be repositioned to align with the physical object 902, and the sectioning control tool 502 may again be presented, in implementations where it was previously removed from view. Further, when the sectioning plane 516 is aligned to the physical element 902, the idealized model 510 may include an indicator 1002 that indicates that the sectioning plane 516 is aligned to the physical element 902.

In practice, although FIGS. 8-10 describe the alignment functionality as being implemented via a selection of an "Align" selectable icon from the sectioning control tool 502, in practice, the BIM viewer software application running on the computing device 200 may provide various ways for a user to implement the aligning functionality. As another example, the GUI of the BIM viewer software application running on the computing device 200 may be configured to present, based on certain user interaction (e.g., a right click on the physical element 902), an options menu including a number of selectable icons to enable various functionality with respect to the physical element 902, of which an alignment selectable icon may be one example. Selection of the alignment selectable icon may enable a user to align a sectioning plane to the physical element 902.

As previously described, various additional features of the BIM viewer software application may involve the use of a 2D visualization of a 2D model of the construction project. Some of these features will be described with respect to FIGS. 10-11. As shown in FIG. 10, the example view 1000 includes a 2D visualization 1004 of the 2D model of the construction project. The 2D visualization 1004 is shown with a 2D sectioning line 1006 that corresponds to the sectioning plane 516. Features of the 2D visualization 1004 and the 2D sectioning line 1006 are further described with respect to FIG. 11.

Figure 11:
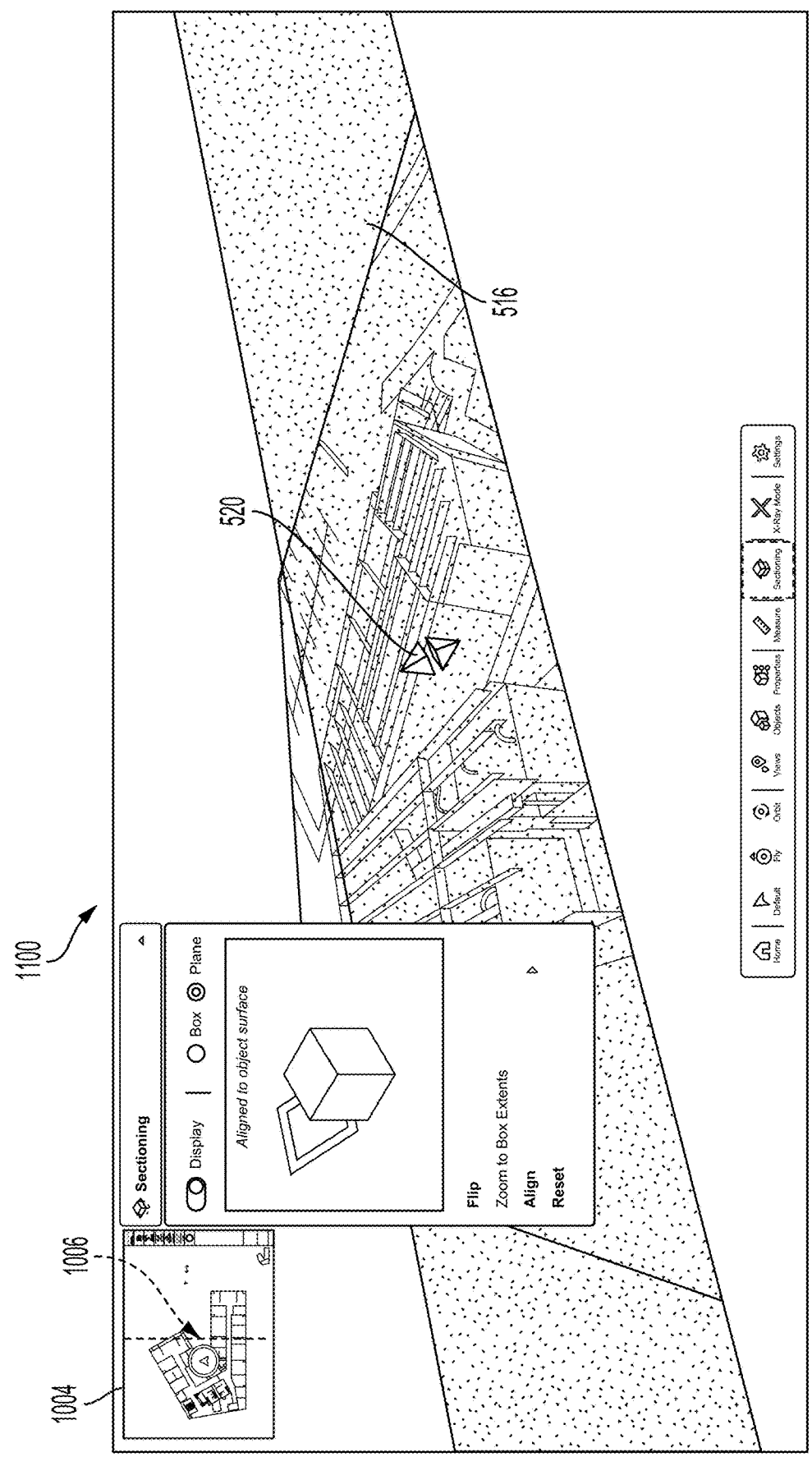
FIG. 11 illustrates another example view that may be presented via a GUI of a BIM viewer software application using a sectioning control tool, according to the present disclosure.

Turning now to FIG. 11, an example view 1100 that may be presented via the GUI of the BIM viewer software application is shown, illustrating a view of the 3D visualization 402 in which a portion of the 3D visualization 402 has been removed.

As may be seen in the example view 1100, the sectioning plane 516 has moved inward along an axis perpendicular to the sectioning plane 516 aligned to the physical object 902. Accordingly, this movement of the sectioning plane 516 results in the portion of the 3D visualization 402 that is between the sectioning plane's previous position in FIG. 10 and the sectioning plane's current position in FIG. 11 to be removed from the view of the 3D visualization 402.

As previously described, the movement of the sectioning plane 516 may be triggered in various ways, such as based on user input indicating an interaction with the sectioning plane 516 (e.g., clicking and dragging the sectioning plane 516 inward along the plane aligned with the physical element 902 relative to the 3D visualization 402), or an interaction with the navigation arrow 520 of the sectioning plane 516, among various other possibilities. Further, in some implementations, the idealized 3D model 510 may, instead of or in addition to comprising the indication 1002 of the aligned status of the sectioning plane 516, comprise an idealized sectioning plane and navigation arrows, similar to the example shown previously in FIG. 5, except that the idealized sectioning plane may be positioned relative to the idealized 3D model 510 in a manner that represents the alignment of the sectioning plane 516 to the physical element 902.

FIG. 11 also illustrates the 2D sectioning line 1006, which has changed location relative to the 2D visualization 1004 in a manner that corresponds with the movement of the sectioning plane 516 relative to the 3D visualization 402. Specifically, the position of the 2D sectioning line 1006 in FIG. 10 may correspond to the position of the sectioning line 516 in FIG. 10, and the adjusted position of the 2D sectioning line 1006 in FIG. 11 may correspond to the adjusted position of the sectioning line 516 in FIG. 11. In practice, this correspondence between the 2D sectioning line's position and the sectioning plane's position may be reciprocal. For instance, a user may interact with the 2D sectioning line 1006 to adjust its position (e.g., by clicking and dragging the 2D sectioning line 1006, among other things), and, based on user input indicating the user interaction with the 2D sectioning line 1006, the BIM viewer software application may adjust the location of the sectioning plane 516 relative to the 3D visualization 402 in a manner that corresponds with the adjustment of the position of the 2D sectioning line 1006 relative to the 2D visualization 1004.

Figure 12:
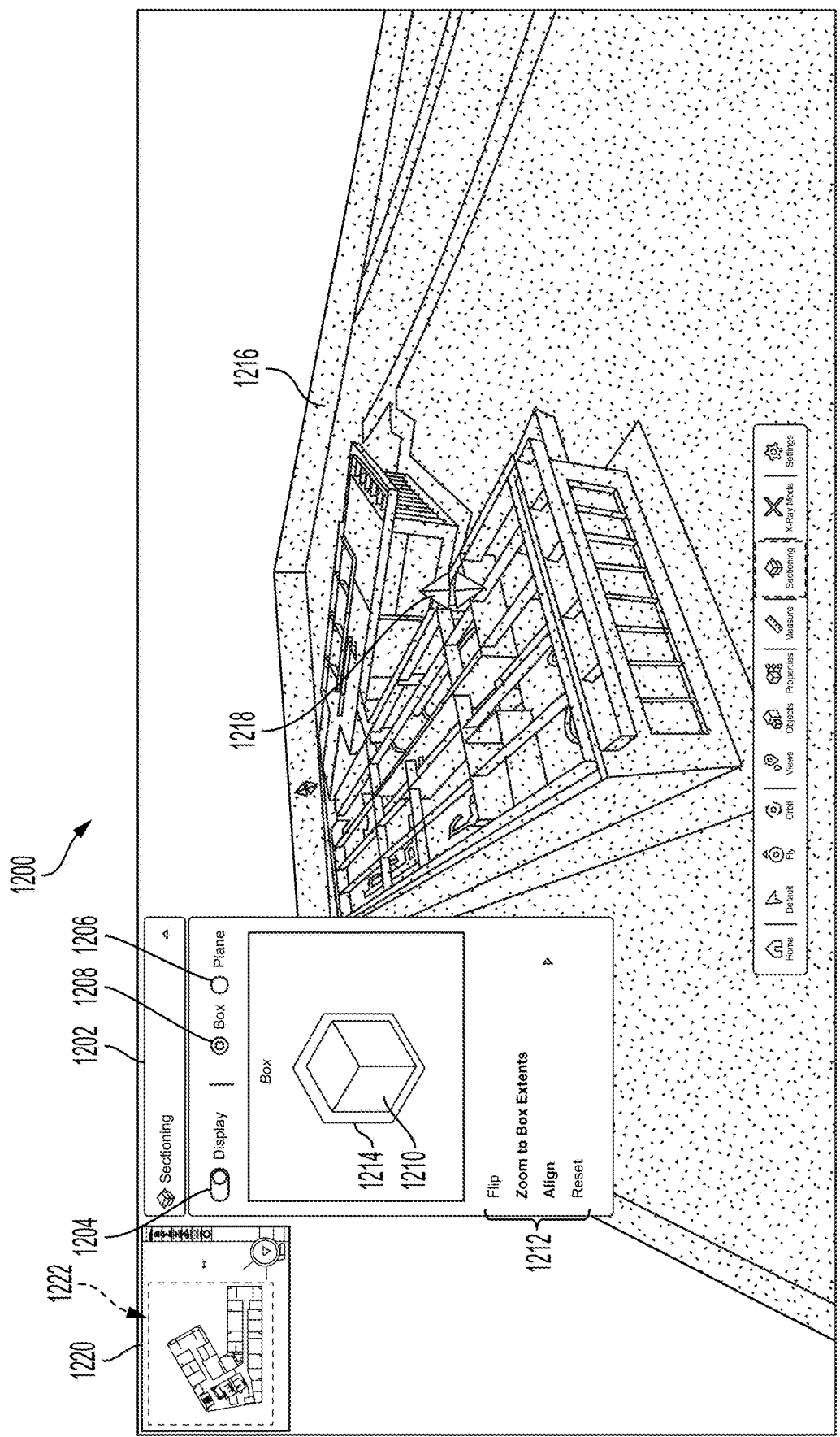
FIG. 12 illustrates another example view that may be presented via a GUI of a BIM viewer software application using a sectioning control tool, according to the present disclosure.

Yet another feature of the BIM viewer software application running on the computing device 200 may be the sectioning box feature mentioned in relation to the box selectable icon 508 shown in FIG. 5. Turning now to FIG. 12, an example view 1200 is shown, which may be presented via the GUI of the BIM viewer software application running on the computing device 200, and which illustrates sectioning box functionality of the BIM viewer software application.

As shown in FIG. 12, the example view 1200 may include a sectioning control tool 1202, which is shown with sub-elements including (i) a display toggle 1204, (ii) a plane selectable icon 1206, (iii) a box selectable icon 1208, (iv) an idealized 3D model 1210, (v) a set of selectable icons 1212, and (vi) an idealized sectioning box 1214. In practice, the sectioning control tool 1202 and various of the sub-elements 1204-1214 may be similar to the sectioning control tool 502 and its respective sub-elements 504-514 shown in FIG. 5, with the exception that in FIG. 12, the box selectable icon 1208 is selected rather than the plane selectable icon 1206, which may result in the idealized sectioning box 1214 being presented relative to the idealized 3D model 1210, rather than an idealized sectioning plane as shown in FIG. 5.

Further, the example view 1200 includes a sectioning box 1216 that encompasses the 3D visualization 402. In practice, each surface of the sectioning box 1216 may operate similarly to a respective sectioning plane. For example, each surface of the sectioning box 1216 may comprise a navigation arrow, of which a navigation arrow 1218 of a top surface of the sectioning box 1216 is shown as a representative example, and user interaction with a respective navigation arrow may cause the computing device 200 to adjust a position of the corresponding surface of the sectioning box 1216 in a manner that corresponds to the user interaction with the respective navigation arrow (e.g., by sliding the surface of the sectioning box 1216 in the direction indicated by the user interaction with the respective navigation arrow).

In some implementations, the idealized sectioning box 1214 may be a static visualization indicating that sectioning box functionality of the sectioning control tool 1202 is enabled via the selection of the box selection icon 1208, rather than sectioning plane functionality. Indeed, although the idealized sectioning plane 514 as described in FIG. 5 has been described as being dynamic (e.g., by adjusting its position relative to the idealized 3D model 510 in a manner that corresponds with adjustments of the position of the sectioning plane 516 relative to the 3D visualization 402), in some implementations the idealized sectioning plane 514 may also be a static visualization, indicating that plane functionality of the sectioning control tool 502 is enabled via the selection of the plane selection icon 506.

Alternatively, the idealized sectioning box 1214 may be dynamic, and may adjust its position relative to the idealized 3D model 1210 in a manner that corresponds to adjustments to the position of the sectioning box 1216 relative to the 3D visualization 402. For example, if a first surface of the sectioning box 1216 is adjusted relative to the 3D visualization 402, and then a second surface of the sectioning box 1216 is adjusted relative to the 3D visualization 402 along a different plane, then the position of a corresponding first and second surface of the idealized sectioning box 1214 may also be adjusted relative to the idealized 3D model 1210 in a manner that corresponds with the adjustments of the first and second surfaces of the sectioning box 1216 relative to the 3D visualization 402. Various other examples may also exist.

Further, in some implementations where the idealized sectioning box 1214 is dynamic, the idealized sectioning box 1214 may be adjustable via user interaction with the idealized sectioning box 1214 (e.g., by clicking and dragging various idealized surfaces of the idealized sectioning box 1214), and the sectioning box 1216 may adjust relative to the 3D visualization 402 in a manner that corresponds with the adjustment of the idealized sectioning box 1214 relative to the idealized 3D model 1210. In some instances, this may track various of the features described above with respect to the idealized sectioning plane 514 and the idealized 3D model 510.

Additionally, in some implementations, the sectioning box 1216 and/or the idealized sectioning box 1214 may be adjusted as a whole, rather than on a per-surface basis. For example, in some implementations, the computing device 200 may adjust the position of the sectioning box 1216 relative to the 3D visualization 402 and/or adjust the position of the idealized sectioning box 1214 relative to the idealized 3D model 1210 (e.g., by shifting the sectioning box 1216 and/or the idealized sectioning box 1214 along one or more planes relative to the 3D visualization 402 and/or the idealized 3D model 1210, respectively), based on certain user input. Such adjustments may not alter the respective dimensions of the sectioning box 1216 and/or the idealized sectioning box 1214. In practice, this may enable a construction professional to use the sectioning box 1216 as a "moving window" to see isolated portions of the 3D visualization 402.

The example view 1200 may also include a 2D visualization 1220 of a 2D model of the construction project. As shown in FIG. 12, the 2D visualization includes a 2D sectioning square 1222 creating a perimeter around the 2D model of the construction project. In practice, the sectioning square 1222 may correspond to the sectioning box 1216 and enable sectioning box functionality in a manner that is similar to how the sectioning line 1006 described with respect to FIGS. 10 and 11 enables sectioning functionality. For instance, the position of the sides of the sectioning square 1222 may adjust relative to the 2D visualization 1220 in a manner that corresponds with adjustments of surfaces of the sectioning box 1216 relative to the 3D visualization 402.

Further, users may interact with the sides of the sectioning square 1222 (e.g., by clicking and dragging them) to adjust dimensions of the sectioning square 1222 relative to the 2D visualization 1220, and the computing device 200 may, via the GUI of the BIM viewer software application, adjust positions of corresponding surfaces of the sectioning box 1216 relative to the 3D visualization 402 in a manner that corresponds to the adjustments to the sides of the sectioning square 1222.

Figure 13A:
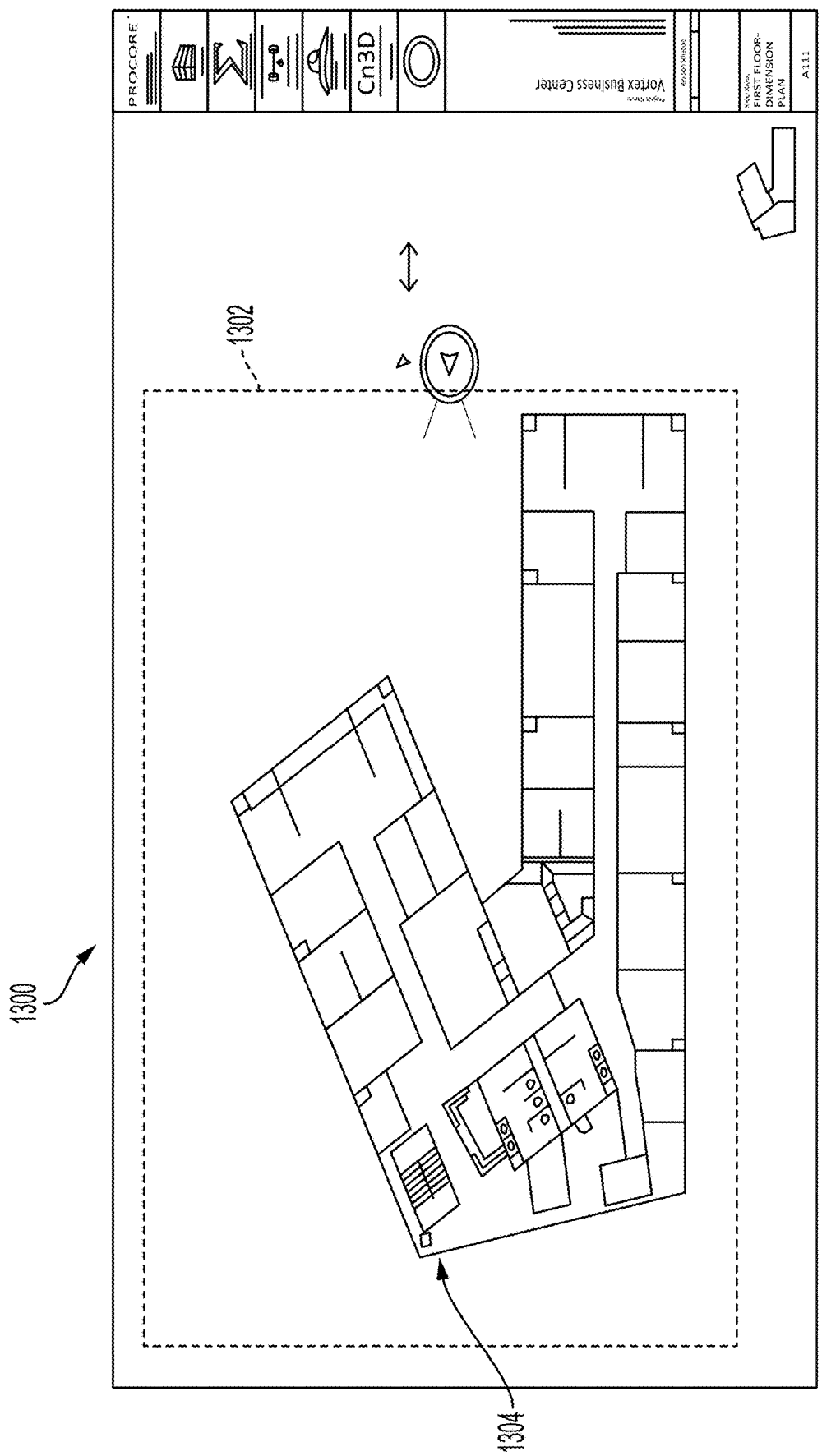
FIG. 13A illustrates an example view of a 2D model that may be presented via a GUI of a BIM viewer software application using a sectioning control tool, according to the present disclosure.
Figure 13B:
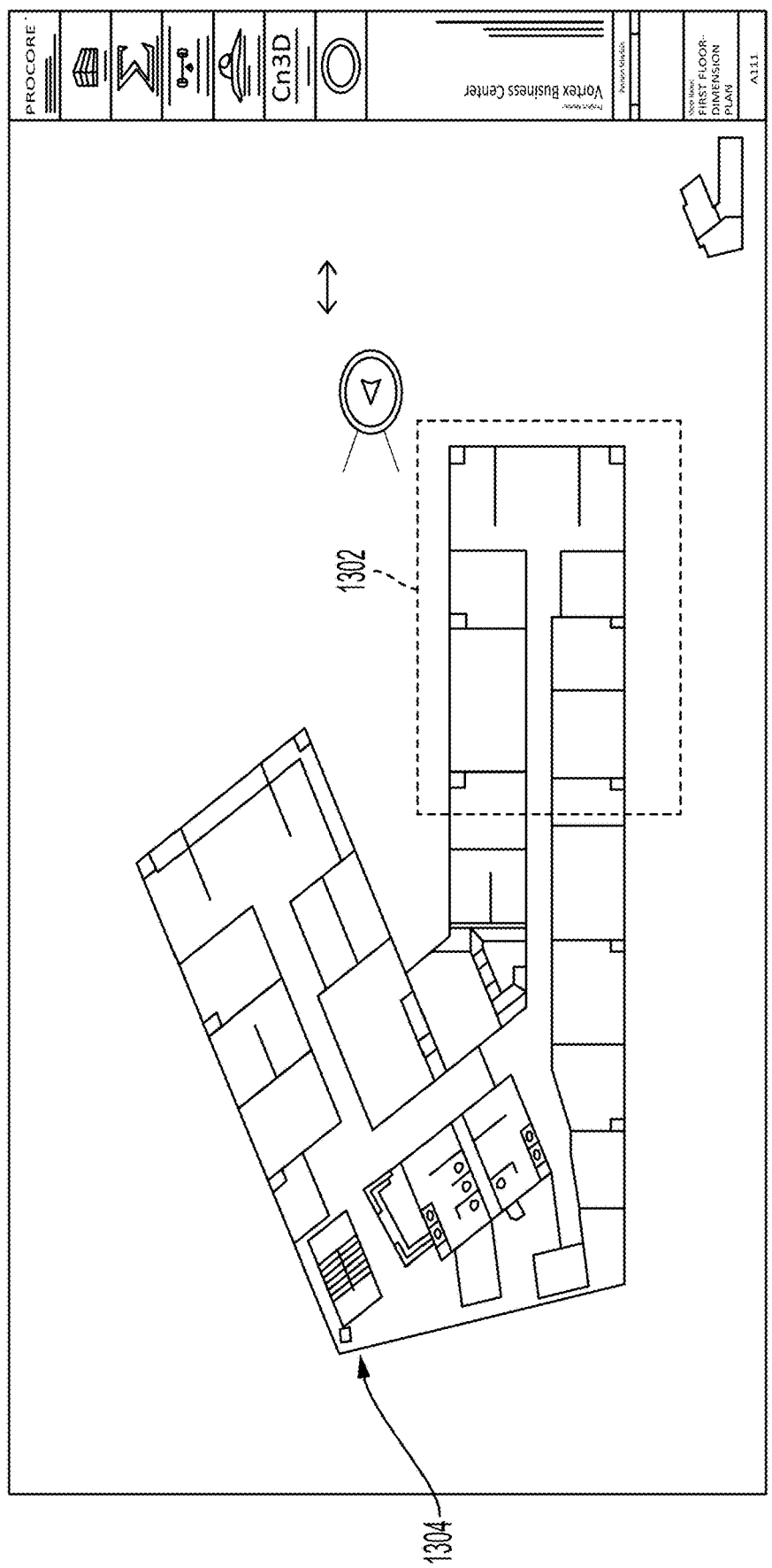
FIG. 13B illustrates another example view of a 2D model that may be presented via a GUI of a BIM viewer software application using a sectioning control tool, according to the present disclosure.

FIGS. 13A-13B illustrate an example of how dimensions of a sectioning square may be resized based on user interaction, according to the present disclosure. Similar to the example shown in FIG. 12, either of the examples views shown in FIGS. 13A-13B may be presented in conjunction with a 3D visualization of a 3D model of the construction project.

Beginning with FIG. 13A, an example view 1300 is shown, which may be presented via the GUI of the BIM viewer software application running on the computing device 200. As shown, the example view 1300 includes a sectioning square 1302 surrounding a 2D visualization 1304 of a 2D model of the construction project. The sectioning square 1302 comprises four sides, each of which may be dynamically adjustable according to various user inputs. For example, user inputs may indicate user interactions with (i) a sectioning box of a 3D visualization of a 3D model of a construction project, (ii) an idealized sectioning box of an idealized 3D model of the 3D visualization, and/or (iii) the sectioning square 1302, among various other examples. Based on any one of the described user inputs, among others, the computing device 200 may adjust (i) a position of a sectioning box relative to a 3D visualization, (ii) a position of an idealized sectioning box relative to an idealized 3D model, and/or (iii) a position of the sectioning square 1302 relative to the 2D visualization 1304.

Adjusting a position of a sectioning square, sectioning box, and/or idealized sectioning box may refer to adjusting one or more dimensions of the sectioning square, sectioning box, and/or idealized sectioning box. As another example, adjusting a position of a sectioning square, sectioning box, and/or idealized sectioning box may refer to moving the position of the sectioning square, sectioning box, and/or idealized sectioning box with respect to an associated 2D visualization, 3D visualization 402, and/or idealized 3D model, respectively, without adjusting dimensions of the sectioning square, sectioning box, and/or idealized sectioning box.

FIG. 13B shows an example of adjustments made to dimensions of the sectioning box 1302 based on user inputs, such as those described. As shown, the sectioning square 1302 has been resized from surrounding the entire construction project shown in the 2D visualization 1304 to covering a bottom right corner of the construction project shown in the 2D visualization 1304.

Figure 14:
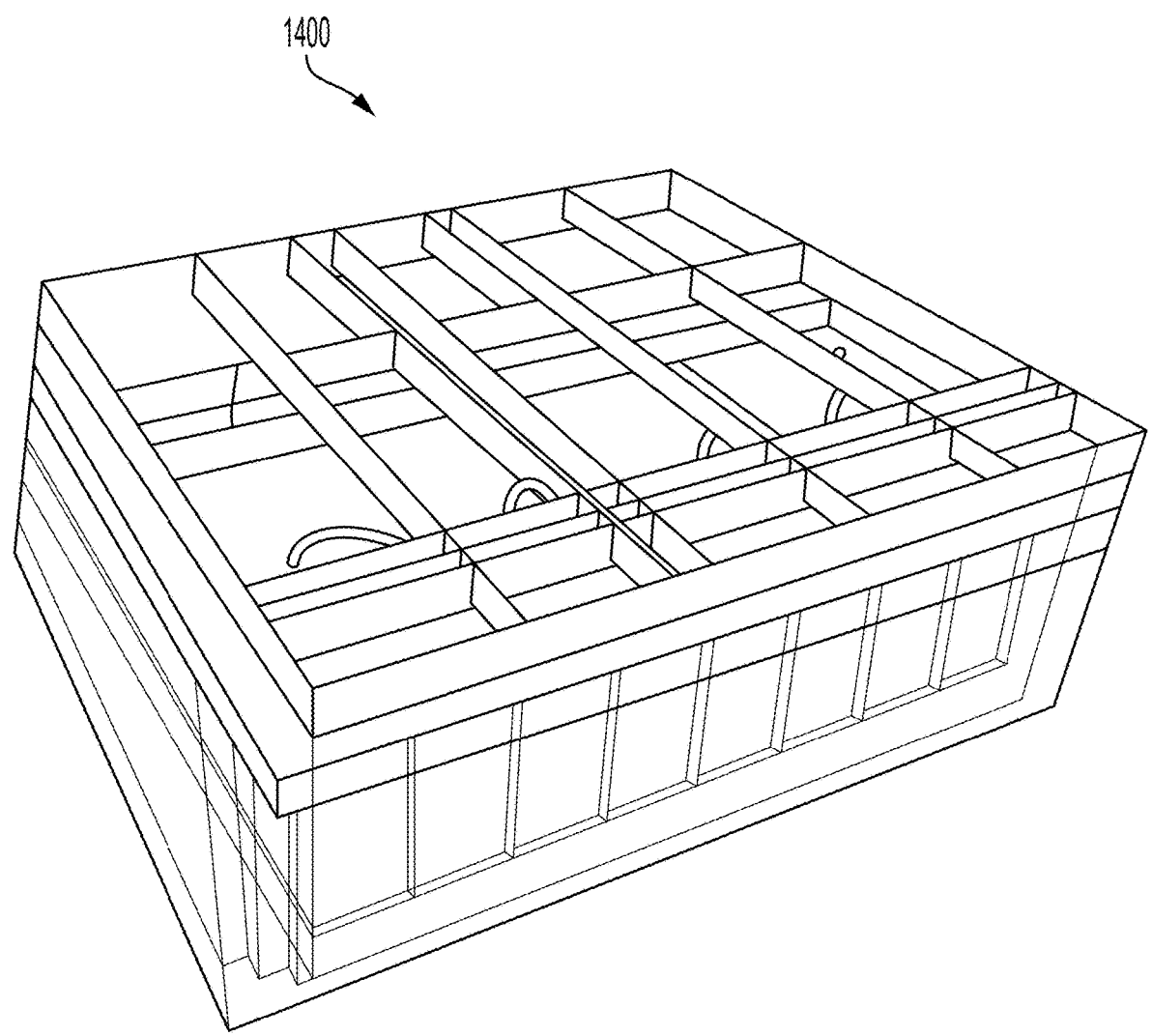
FIG. 14 illustrates another example view of a 3D model that may be presented via a GUI of a BIM viewer software application using a sectioning control tool, according to the present disclosure.

FIG. 14 shows an example view 1400 of a 3D visualization 402 when several portions of the 3D visualization 402 have been cut away, either via a number of sectioning planes or via a sectioning box, as previously described. For example, the example view 1400 in FIG. 14 may be the 3D visualization that corresponds to the 2D visualization 1304 that is defined by the sectioning square 1302, as shown in FIG. 13B.

Additional features that may be enabled via the BIM viewer software application running on the computing device 200 may include enabling the user of the computing device 200 to save a certain view and/or certain settings of the sectioning tool to an account associated with the user of the computing device 200, making saved views and/or settings accessible to other users, e.g., with other accounts, as well as providing suggestions as to specific ways to adjust the location of a given sectioning plane or sectioning box, among other possibilities. Such features may enhance the functionality of the BIM viewer software application both for the construction professional using the computing device 200, as well as for collaborative efforts between groups of construction professionals.

To help describe some of these operations, flow diagrams, such as the flowchart 300 of FIG. 3, may also be referenced to describe combinations of operations that may be performed by a computing device. In some cases, a block in any one of the flow diagrams may represent a module or portion of program code that includes instructions that are executable by a processor to implement specific logical functions or steps in a process. The program code may be stored on any type of computer-readable medium, such as non-transitory computer readable media (e.g., the data storage 204 shown in FIG. 2). In other cases, a block in the flowchart of FIG. 3 may represent circuitry that is wired to perform specific logical functions or steps in a process. Moreover, the blocks shown in the flowchart 300 of FIG. 3 may be rearranged into different orders, combined into fewer blocks, separated into additional blocks, and/or removed, based upon the particular embodiment. The flowchart 300 of FIG. 3 may also be modified to include additional blocks that represent other functionality that is described expressly or implicitly elsewhere herein.

V. CONCLUSION

Example embodiments of the disclosed innovations have been described above. Those skilled in the art will understand, however, that changes and modifications may be made to the embodiments described without departing from the true scope and spirit of the present invention, which will be defined by the claims.

Further, to the extent that examples described herein involve operations performed or initiated by actors, such as "users" or other entities, this is for purposes of example and explanation only. Claims should not be construed as requiring action by such actors unless explicitly recited in claim language.

We claim:

1. A computing system comprising:
   at least one processor;
   at least one non-transitory computer-readable medium; and
   program instructions stored on the at least one non-transitory computer-readable medium that are executable by the at least one processor such that the computing system is configured to:
   present (i) a three-dimensional (3D) visualization of a 3D model, (ii) a sectioning plane that defines a view of the 3D visualization of the 3D model, and (iii) a 3D sectioning control tool that represents the 3D visualization of the 3D model and that is configured to set a location of the sectioning plane;
   receive user input indicating an interaction with the 3D sectioning control tool; and
   based on the user input, adjust the location of the sectioning plane relative to the 3D visualization of the 3D model and thereby adjust the view of the 3D visualization of the 3D model.

2. The computing system of claim 1, wherein the sectioning plane intersects the 3D visualization of the 3D model to define (i) a first portion of the 3D visualization of the 3D model to a first side of the sectioning plane and (ii) a second portion of the 3D visualization of the 3D model to a second side of the sectioning plane opposite the first side, the computing system further comprising program instructions that are executable by the at least one processor such that the computing system is configured to:
   remove the first portion of the 3D visualization of the 3D model, such that the sectioning plane defines the view of the 3D visualization of the 3D model as the second portion of the 3D visualization of the 3D model.

3. The computing system of claim 1, wherein the program instructions that are executable by the at least one processor such that the computing system is configured to receive the user input indicating the interaction with the 3D sectioning control tool comprise program instructions that are executable by the at least one processor such that the computing system is configured to receive user input indicating a selection of a control surface of the 3D sectioning control tool.

4. The computing system of claim 3, wherein the program instructions that are executable by the at least one processor such that the computing system is configured to adjust the location of the sectioning plane comprise program instructions that are executable by the at least one processor such that the computing system is configured to align the sectioning plane with a reference plane of the 3D visualization of the 3D model that corresponds to the selected control surface of the 3D sectioning control tool.

5. The computing system of claim 1, wherein the program instructions that are executable by the at least one processor such that the computing system is configured to receive the user input indicating the interaction with the 3D sectioning control tool comprise program instructions that are executable by the at least one processor such that the computing system is configured to receive user input indicating an adjustment of a location of a control plane presented on the 3D sectioning control tool relative to the 3D sectioning control tool.

6. The computing system of claim 5, wherein the program instructions that are executable by the at least one processor such that the computing system is configured to adjust the location of the sectioning plane comprise program instructions that are executable by the at least one processor such that the computing system is configured to adjust the location of the sectioning plane relative to the 3D visualization of the 3D model in a manner that corresponds to the adjustment of the location of the control plane relative to the 3D sectioning control tool.

7. The computing system of claim 1, wherein the user input comprises first user input, the computing system further comprising program instructions that are executable by the at least one processor such that the computing system is configured to:
receive second user input indicating an interaction with the sectioning plane; and
based on the second user input:
adjust the location of the sectioning plane relative to the 3D visualization of the 3D model; and
adjust a location of a control plane presented on the 3D sectioning control tool relative to the 3D sectioning control tool in a manner that corresponds to the adjustment of the location of the sectioning plane relative to the 3D visualization of the 3D model.

8. The computing system of claim 7, wherein the program instructions that are executable by the at least one processor such that the computing system is configured to receive the second user input comprise program instructions that are executable by the at least one processor such that the computing system is configured to receive user input indicating an interaction with a navigation arrow of the sectioning plane.

9. The computing system of claim 1, further comprising program instructions that are executable by the at least one processor such that the computing system is configured to present (iv) a two-dimensional (2D) visualization of a 2D model corresponding to the 3D visualization of the 3D model and (v) a sectioning line of the 2D visualization, wherein the sectioning line corresponds to the sectioning plane.

10. The computing system of claim 9, further comprising program instructions that are executable by the at least one processor such that the computing system is configured to, based on the user input, adjust a location of the sectioning line relative to the 2D visualization of the 2D model in a manner that corresponds to the adjustment of the location of the sectioning plane relative to the 3D visualization of the 3D model.

11. The computing system of claim 10, wherein the user input comprises first user input, further comprising program instructions that are executable by the at least one processor such that the computing system is configured to:
receive second user input indicating an interaction with the sectioning line; and
based on the second user input:
adjust the location of the sectioning line relative to the 2D visualization of the 2D model; and
adjust the location of the sectioning plane relative to the 3D visualization of the 3D model in a manner that corresponds to the adjustment of the location of the sectioning line relative to the 2D visualization of the 2D model.

12. The computing system of claim 1, wherein the sectioning plane forms a portion of a sectioning box with at least one other sectioning plane.

13. A non-transitory computer-readable medium, wherein the non-transitory computer-readable medium is provisioned with program instructions that, when executed by at least one processor, cause a computing system to:
present (i) a three-dimensional (3D) visualization of a 3D model, (ii) a sectioning plane that defines a view of the 3D visualization of the 3D model, and (iii) a 3D sectioning control tool that represents the 3D visualization of the 3D model and that is configured to set a location of the sectioning plane;
receive user input indicating an interaction with the 3D sectioning control tool; and
based on the user input, adjust the location of the sectioning plane relative to the 3D visualization of the 3D model and thereby adjust the view of the 3D visualization of the 3D model.

14. The non-transitory computer-readable medium of claim 13, wherein the sectioning plane intersects the 3D visualization of the 3D model to define (i) a first portion of the 3D visualization of the 3D model to a first side of the sectioning plane and (ii) a second portion of the 3D visualization of the 3D model to a second side of the sectioning plane opposite the first side, and wherein the non-transitory computer-readable medium is also provisioned with program instructions that, when executed by at least one processor, cause the computing system to:
remove the first portion of the 3D visualization of the 3D model, such that the sectioning plane defines the view of the 3D visualization of the 3D model as the second portion of the 3D visualization of the 3D model.

15. The non-transitory computer-readable medium of claim 13, wherein the program instructions that, when executed by at least one processor, cause the computing system to receive the user input indicating the interaction with the 3D sectioning control tool comprise program instructions that, when executed by at least one processor, cause the computing system to receive user input indicating a selection of a control surface of the 3D sectioning control tool.

16. The non-transitory computer-readable medium of claim 15, wherein the program instructions that, when executed by at least one processor, cause the computing system to adjust the location of the sectioning plane comprise program instructions that, when executed by at least one processor, cause the computing system to align the sectioning plane with a reference plane of the 3D visualization of the 3D model that corresponds to the selected control surface of the 3D sectioning control tool.

17. The non-transitory computer-readable medium of claim 13, wherein the program instructions that, when executed by at least one processor, cause the computing system to receive the user input indicating the interaction with the 3D sectioning control tool comprise program instructions that, when executed by at least one processor, cause the computing system to receive user input indicating an adjustment of a location of a control plane presented on the 3D sectioning control tool relative to the 3D sectioning control tool.

18. The non-transitory computer-readable medium of claim 17, wherein the program instructions that, when executed by at least one processor, cause the computing system to adjust the location of the sectioning plane comprise program instructions that, when executed by at least one processor, cause the computing system to adjust the location of the sectioning plane relative to the 3D visualization of the 3D model in a manner that corresponds to the adjustment of the location of the control plane relative to the 3D sectioning control tool.

19. The non-transitory computer-readable medium of claim 13, wherein the user input comprises first user input, and wherein the non-transitory computer-readable medium is also provisioned with program instructions that, when executed by at least one processor, cause the computing system to:

receive second user input indicating an interaction with the sectioning plane; and based on the second user input:
- adjust the location of the sectioning plane relative to the 3D visualization of the 3D model; and
- adjust a location of a control plane presented on the 3D sectioning control tool relative to the 3D sectioning control tool in a manner that corresponds to the adjustment of the location of the sectioning plane relative to the 3D visualization of the 3D model.

20. A method implemented by a computing system, the method comprising:

presenting (i) a three-dimensional (3D) visualization of a 3D model, (ii) a sectioning plane that defines a view of the 3D visualization of the 3D model, and (iii) a 3D sectioning control tool that represents the 3D visualization of the 3D model and that is configured to set a location of the sectioning plane;

receiving user input indicating an interaction with the 3D sectioning control tool; and based on the user input, adjusting the location of the sectioning plane relative to the 3D visualization of the 3D model and thereby adjusting the view of the 3D visualization of the 3D model.

\* \* \* \* \*

UNITED STATES PATENT AND TRADEMARK OFFICE
CERTIFICATE OF CORRECTION

| | |
|---|---|
| PATENT NO. | : 12,387,450 B2 |
| APPLICATION NO. | : 18/752074 |
| DATED | : August 12, 2025 |
| INVENTOR(S) | : Maria E. Stegner et al. |

It is certified that error appears in the above-identified patent and that said Letters Patent is hereby corrected as shown below:

On the Title Page

Item (73) Assignee: please delete "Procure Technologies, Inc." and insert -- Procore Technologies, Inc. --.

Signed and Sealed this
Eleventh Day of November, 2025

John A. Squires
*Director of the United States Patent and Trademark Office*